(12) United States Patent
Alrod et al.

(10) Patent No.: US 8,806,307 B2
(45) Date of Patent: Aug. 12, 2014

(54) INTERRUPTION CRITERIA FOR BLOCK DECODING

(71) Applicant: Ramot At Tel Aviv University Ltd., Tel Aviv (IL)

(72) Inventors: Idan Alrod, Herzliya (IL); Eran Sharon, Rishon Lezion (IL); Simon Litsyn, Giv'at Shmuel (IL)

(73) Assignee: Ramot at Tel Aviv University Ltd., Tel Aviv (IL)

( * ) Notice: Subject to any disclaimer, the term of this patent is extended or adjusted under 35 U.S.C. 154(b) by 0 days.

(21) Appl. No.: 13/732,888

(22) Filed: Jan. 2, 2013

(65) Prior Publication Data

US 2013/0132791 A1    May 23, 2013

Related U.S. Application Data

(60) Division of application No. 12/646,995, filed on Dec. 24, 2009, now Pat. No. 8,370,711, which is a continuation-in-part of application No. 12/469,790, filed on May 21, 2009.

(60) Provisional application No. 61/074,701, filed on Jun. 23, 2008.

(51) Int. Cl.
  *H03M 13/00* (2006.01)
(52) U.S. Cl.
  USPC ........................................... 714/780; 714/752
(58) Field of Classification Search
  None
  See application file for complete search history.

(56) References Cited

U.S. PATENT DOCUMENTS

| | | |
|---|---|---|
| 5,467,971 A | 11/1995 | Hurtubise et al. |
| 5,573,902 A | 11/1996 | Daubendick et al. |
| 5,576,171 A | 11/1996 | Olm et al. |
| 5,582,965 A | 12/1996 | Deaton et al. |
| 5,608,867 A | 3/1997 | Ishihara |
| 5,612,175 A | 3/1997 | Eshelman et al. |
| 5,612,176 A | 3/1997 | Eshelman et al. |
| 5,612,177 A | 3/1997 | Levy et al. |
| 5,614,358 A | 3/1997 | Wilson et al. |
| 5,614,359 A | 3/1997 | Eshelman et al. |

(Continued)

FOREIGN PATENT DOCUMENTS

| | | |
|---|---|---|
| AU | 2000/037762 A1 | 10/2000 |
| AU | 2000/061951 A1 | 2/2001 |

(Continued)

OTHER PUBLICATIONS

Office Action for U.S. Appl. No. 12/469,790; dated Feb. 15, 2013.

(Continued)

*Primary Examiner* — Michael Maskulinski
(74) *Attorney, Agent, or Firm* — Alston & Bird LLP

(57) ABSTRACT

While decoding a representation, imported from a channel, of a codeword that encodes K information bits as N>K codeword bits, by updating estimates of the codeword bits in a plurality of iterations, the iterations are interrupted upon satisfaction of an interruption criterion that is either an order-dependent interruption criterion or an interruption criterion that includes an estimate of mutual information of the codeword and a vector that is used in the decoding iterations. Either the iterations are terminated or the iterations are resumed after one or more elements of one or more vectors used in the iterations is/are modified.

10 Claims, 16 Drawing Sheets

(56) References Cited

U.S. PATENT DOCUMENTS

| | | |
|---|---|---|
| 5,641,618 A | 6/1997 | Wen et al. |
| 5,663,041 A | 9/1997 | Chang et al. |
| 5,666,543 A | 9/1997 | Gartland |
| 5,672,467 A | 9/1997 | Buitano et al. |
| 5,726,005 A | 3/1998 | Chen et al. |
| 5,728,516 A | 3/1998 | Edwards et al. |
| 5,728,517 A | 3/1998 | Bryant et al. |
| 5,736,310 A | 4/1998 | Chen et al. |
| 5,744,297 A | 4/1998 | Chang et al. |
| 5,776,959 A | 7/1998 | Covey et al. |
| 5,824,460 A | 10/1998 | Dickerson |
| 5,880,466 A | 3/1999 | Benner |
| 6,027,869 A | 2/2000 | Maskasky et al. |
| 6,066,666 A | 5/2000 | Covey et al. |
| 6,090,536 A | 7/2000 | Maskasky et al. |
| 6,130,090 A | 10/2000 | Heintz et al. |
| 6,156,574 A | 12/2000 | Heintz et al. |
| 6,187,525 B1 | 2/2001 | Maskasky et al. |
| 6,225,036 B1 | 5/2001 | Maskasky et al. |
| 6,264,416 B1 | 7/2001 | Eaton, Jr. |
| 6,365,336 B1 | 4/2002 | Maskasky et al. |
| 6,383,730 B1 | 5/2002 | Maskasky et al. |
| 6,391,534 B1 | 5/2002 | Maskasky et al. |
| 6,395,465 B1 | 5/2002 | Maskasky et al. |
| 6,485,912 B1 | 11/2002 | Heintz et al. |
| 6,513,154 B1 | 1/2003 | Porterfield |
| 6,518,007 B1 | 2/2003 | Reed et al. |
| 6,680,331 B2 | 1/2004 | Ferrendelli et al. |
| 6,740,483 B1 | 5/2004 | Royster, Jr. |
| 6,756,188 B2 | 6/2004 | Keevert et al. |
| 6,803,182 B1 | 10/2004 | Royster, Jr. |
| 6,893,809 B2 | 5/2005 | Reed et al. |
| 7,023,735 B2 | 4/2006 | Ban et al. |
| 7,046,403 B1 | 5/2006 | Yhann |
| 7,164,494 B1 | 1/2007 | Dalton |
| 7,171,802 B2 | 2/2007 | Inoue et al. |
| 7,197,690 B2 | 3/2007 | Shen et al. |
| 7,206,463 B2 | 4/2007 | Nishide et al. |
| 7,222,284 B2 | 5/2007 | Stolpman |
| 7,237,181 B2 | 6/2007 | Richardson |
| 7,281,192 B2 | 10/2007 | Shen et al. |
| 7,296,216 B2 | 11/2007 | Shen et al. |
| 7,337,375 B2 | 2/2008 | Agazzi et al. |
| 7,370,265 B2 | 5/2008 | Shen et al. |
| 7,379,209 B1 | 5/2008 | Dalton |
| 7,383,487 B2 | 6/2008 | Shen et al. |
| 7,383,493 B2 * | 6/2008 | Shen et al. .................. 714/801 |
| 7,395,494 B2 * | 7/2008 | Lee et al. .................... 714/801 |
| 7,395,495 B2 | 7/2008 | Jacobsen |
| 7,564,933 B2 | 7/2009 | Marrow |
| 7,707,476 B2 | 4/2010 | Seki |
| 7,752,524 B2 | 7/2010 | Wehn et al. |
| 7,770,090 B1 | 8/2010 | Kons et al. |
| 8,127,209 B1 * | 2/2012 | Zhang et al. ................ 714/780 |
| 8,145,987 B2 * | 3/2012 | Shen et al. .................. 714/804 |
| 8,219,878 B1 * | 7/2012 | Varnica et al. .............. 714/758 |
| 8,245,098 B2 * | 8/2012 | Han et al. .................... 714/752 |
| 2001/0028690 A1 | 10/2001 | Ebel, Sr. |
| 2002/0026615 A1 | 2/2002 | Hewitt et al. |
| 2002/0042899 A1 | 4/2002 | Tzannes et al. |
| 2003/0066018 A1 | 4/2003 | Yu et al. |
| 2003/0078283 A1 | 4/2003 | Ferrendelli et al. |
| 2004/0063048 A1 | 4/2004 | Reed et al. |
| 2004/0067455 A1 | 4/2004 | Keevert et al. |
| 2004/0081371 A1 | 4/2004 | Nishide et al. |
| 2004/0268205 A1 | 12/2004 | Stolpman |
| 2005/0055999 A1 | 3/2005 | Inou et al. |
| 2005/0138520 A1 | 6/2005 | Richardson |
| 2005/0149843 A1 | 7/2005 | Shen et al. |
| 2005/0154957 A1 | 7/2005 | Jacobsen |
| 2005/0166132 A1 | 7/2005 | Shen et al. |
| 2005/0193320 A1 | 9/2005 | Varnica et al. |
| 2005/0229088 A1 | 10/2005 | Tzannes et al. |
| 2006/0005105 A1 | 1/2006 | Yoshida |
| 2006/0013181 A1 | 1/2006 | Stolpman et al. |
| 2006/0087220 A1 | 4/2006 | Hiroki et al. |
| 2007/0033484 A1 | 2/2007 | Kim et al. |
| 2007/0105595 A1 | 5/2007 | Prasad et al. |
| 2007/0113146 A1 | 5/2007 | Li et al. |
| 2007/0113163 A1 | 5/2007 | Golitschek Edler Von Elbwart et al. |
| 2007/0153838 A1 | 7/2007 | Pons et al. |
| 2007/0157065 A1 | 7/2007 | Pons et al. |
| 2007/0162815 A1 | 7/2007 | El-Khamy et al. |
| 2007/0162818 A1 | 7/2007 | Shen et al. |
| 2007/0168834 A1 | 7/2007 | Eroz et al. |
| 2007/0180345 A1 | 8/2007 | Ismail |
| 2007/0195894 A1 | 8/2007 | Shokrollahi et al. |
| 2007/0198905 A1 | 8/2007 | Bhatt et al. |
| 2007/0204197 A1 | 8/2007 | Yokokawa |
| 2007/0204198 A1 | 8/2007 | Kyung et al. |
| 2007/0206638 A1 | 9/2007 | Santoru et al. |
| 2007/0220397 A1 | 9/2007 | Kyung et al. |
| 2007/0226578 A1 | 9/2007 | Eroz et al. |
| 2007/0226584 A1 | 9/2007 | Hong et al. |
| 2007/0234178 A1 | 10/2007 | Richardson et al. |
| 2007/0234179 A1 | 10/2007 | Eroz et al. |
| 2007/0234184 A1 | 10/2007 | Richardson |
| 2007/0245211 A1 | 10/2007 | Kim et al. |
| 2007/0260944 A1 | 11/2007 | Cameron et al. |
| 2007/0266300 A1 | 11/2007 | Ito et al. |
| 2007/0283216 A1 | 12/2007 | Kyung et al. |
| 2007/0283220 A1 | 12/2007 | Kim |
| 2007/0283221 A1 | 12/2007 | Kyung et al. |
| 2007/0300135 A1 | 12/2007 | Kamiya |
| 2008/0005650 A1 | 1/2008 | Shen et al. |
| 2008/0010579 A1 | 1/2008 | Park et al. |
| 2008/0016426 A1 | 1/2008 | Li et al. |
| 2008/0018802 A1 | 1/2008 | Yu |
| 2008/0028271 A1 | 1/2008 | Chen |
| 2008/0028274 A1 | 1/2008 | Lin |
| 2008/0065947 A1 | 3/2008 | Eroz et al. |
| 2008/0065953 A1 | 3/2008 | Sun et al. |
| 2008/0065961 A1 | 3/2008 | Shen et al. |
| 2008/0065972 A1 | 3/2008 | Eroz et al. |
| 2008/0082868 A1 | 4/2008 | Tran et al. |
| 2008/0082894 A1 | 4/2008 | Eroz et al. |
| 2008/0082895 A1 | 4/2008 | Eroz et al. |
| 2008/0082897 A1 | 4/2008 | Brandman et al. |
| 2008/0092026 A1 | 4/2008 | Brandman et al. |
| 2008/0109698 A1 | 5/2008 | Yang et al. |
| 2008/0109699 A1 | 5/2008 | Stolpman |
| 2008/0126908 A1 | 5/2008 | Lin |
| 2008/0148128 A1 | 6/2008 | Sharon et al. |
| 2008/0163025 A1 | 7/2008 | Djordjevic et al. |
| 2008/0163032 A1 | 7/2008 | Lastras-Montano |
| 2008/0165889 A1 | 7/2008 | Shapiro |
| 2008/0168324 A1 | 7/2008 | Xu et al. |
| 2008/0178065 A1 | 7/2008 | Khandekar et al. |
| 2008/0181291 A1 | 7/2008 | Zhou et al. |
| 2008/0181344 A1 | 7/2008 | Jiang et al. |
| 2008/0189589 A1 | 8/2008 | Park et al. |
| 2008/0201631 A1 | 8/2008 | Tillich et al. |
| 2008/0215950 A1 | 9/2008 | Shen et al. |
| 2008/0229168 A1 | 9/2008 | Murakami et al. |
| 2008/0282129 A1 | 11/2008 | Blanksby |
| 2008/0294960 A1 | 11/2008 | Sharon |
| 2009/0006906 A1 | 1/2009 | Jacobsen et al. |
| 2009/0013237 A1 | 1/2009 | Lin et al. |
| 2009/0013238 A1 | 1/2009 | Blanksby et al. |
| 2009/0013239 A1 | 1/2009 | Blanksby et al. |
| 2009/0019335 A1 | 1/2009 | Boyer et al. |
| 2009/0049358 A1 | 2/2009 | Jalloul et al. |
| 2009/0063926 A1 | 3/2009 | Cho et al. |
| 2009/0138780 A1 | 5/2009 | Berens et al. |
| 2009/0193313 A1 | 7/2009 | Kong et al. |
| 2009/0199074 A1 | 8/2009 | Sommer |
| 2009/0282320 A1 | 11/2009 | Liao et al. |
| 2009/0319868 A1 | 12/2009 | Sharon et al. |

(56) References Cited

U.S. PATENT DOCUMENTS

| | | |
|---|---|---|
| 2010/0042897 A1 | 2/2010 | Han et al. |
| 2011/0113294 A1 | 5/2011 | Chugg et al. |
| 2011/0154156 A1 | 6/2011 | Li et al. |

FOREIGN PATENT DOCUMENTS

| | | |
|---|---|---|
| AU | 2002 327253 A1 | 3/2003 |
| AU | 769030 B2 | 1/2004 |
| EP | 0 699 944 A1 | 3/1996 |
| EP | 0 699 946 A1 | 3/1996 |
| EP | 0 699 948 A1 | 3/1996 |
| EP | 0 699 950 A1 | 3/1996 |
| EP | 0 718 679 A1 | 6/1996 |
| EP | 1 031 640 A1 | 8/2000 |
| EP | 1 213 607 A1 | 6/2002 |
| EP | 1 553 705 A1 | 7/2005 |
| EP | 1 553 706 A1 | 7/2005 |
| EP | 1 612 948 A1 | 1/2006 |
| EP | 1 909 394 A2 | 4/2008 |
| WO | WO 96/07136 A1 | 3/1996 |
| WO | WO 96/13757 A1 | 5/1996 |
| WO | WO 00/59586 A1 | 10/2000 |
| WO | WO 01/09297 A1 | 2/2001 |
| WO | WO 01/97387 A1 | 12/2001 |
| WO | WO 03/007940 A1 | 1/2003 |
| WO | WO 2004/114526 A2 | 12/2004 |
| WO | WO 2005/062840 A2 | 7/2005 |
| WO | WO 2005/077108 A2 | 8/2005 |
| WO | WO 2006/055086 A1 | 5/2006 |
| WO | WO 2006/076834 A1 | 7/2006 |
| WO | WO 2006/117135 A1 | 11/2006 |
| WO | WO 2006/123543 A1 | 11/2006 |
| WO | WO-2007/001305 A1 | 1/2007 |
| WO | WO 2007/004019 A2 | 1/2007 |
| WO | WO 2007/026953 A1 | 3/2007 |
| WO | WO 2008/034286 A1 | 3/2008 |
| WO | WO 2008/034287 A1 | 3/2008 |
| WO | WO 2008/034291 A1 | 3/2008 |
| WO | WO 2009/005732 A1 | 1/2009 |
| WO | WO 2009/023962 A1 | 2/2009 |
| WO | WO-2009/156869 A1 | 12/2009 |
| WO | WO-2009/156871 A1 | 12/2009 |
| WO | WO-2009/156883 A1 | 12/2009 |
| WO | WO-2009/156935 A1 | 12/2009 |

OTHER PUBLICATIONS

Ahmed, N., Reliability-Based Schedule for Bit-Flipping Decoding of Low-Density Parity-Check Codes, 2004, *IEEE*.

Alghonaim, E. et al., *New Technique for Improving Performance of LDPC Codes in the Presence of Trapping Sets*, Hindawi Publishing Corporation, EURASIP Journal on Wireless Communications and Networking, vol. 2008, Article ID 362897, 12 pages.

Alleyne, D. et al., *On Stopping Criteria for Low-Density Parity-Check Codes*, Communication Systems, Networks and Digital Signal Processing, 2008. CNSDSP 2008. 6th International Symposium, Jul. 2008, 633-637.

Andriyanova, I. et al., *A Family of Non-Binary TLDPC Codes: Density Evolution, Convergence and Thresholds*, ISIT2007, IEEE (2007). 1216-1220.

Casado, A. I. V. et al., *Improving LDPC Decoders via Informed Dynamic Scheduling*, ITW 2007, Lake Tahoe, CA, Sep. 2-6, 2007, 208-213.

Cavus, E. et al., *A Performance Improvement and Error Floor Avoidance Technique for Belief Propagation Decoding of LDPC Codes*, 2005 IEEE 16th Intercational Symposium on Personal Indoor and Mobile Radio Communication, (online) 2005, XP002538103 Retrieved from the Internet: URL: http://ieeexplore.ieee.org/stampstamp.jsp?tp=&arnember=1651870&isnumber=34629 (retrieved on Jul. 21, 2009) pp. 2386-2390.

Gallager, R. G., *Low-Density Parity-Check Codes*, Cambridge, MA: MIT Press 1963, 90 pages.

Goldberger, J., *Serial Schedules for Belief-Propagation: Analysis of Convergence Time*, IEEE, vol. 54, No. 3 (2008), 1316-1319.

Han, Y. et al., *LDPC Decoder Strategies for Achieving Low Error Floors*, Internet Article, (Online) Feb. 1, 2008, XP002538104 Retrieved from the Internet: URL: http://ieeexplore.ieee.org/stamp/stampjsp?arnember=04601062—(retrieved on Jul. 21, 2009) the whole document, p. 1.

Kienle, F. et al., *Low Complexity Stopping Criterion for LDPC Code Decoders*, Pro. IEEE VTC 2005-Spring, Stockholm, Sweden, Jun. 2005, 606-609.

Iryna, A., *A Family of Non-Binary TLDPC Codes: Density Evolution, Convergence and Thresholds*, 2007, IEEE, pp. 1216-1220.

Landner, S. et al., *Two Methods for Reducing the Error-Floor of LDPC Codes*, arXiv:cs/0701006v1 [cs.IT] Dec. 30, 2006, 50 pages.

Nouh, Ahmed, *Reliability-Based Schedule for Bit-flipping Decoding of Low-Density Parity-Check Codes*, IEEE, vol. 52, No. 12 (2004), 2038-2040.

Richardson, T., *Error Floors of LDCP Codes*, Internet Article, (Online) 2003, XP002538097, Retrieved from the Internet: URL: http://www.stanford.edu/class/ee388/handouts/richardson_ef.pdf (retrieved on Jul. 21, 2009) the whole document, p. 1426-1435.

Sharon, E. et al., *Analysis of Low-Density Parity-Check Codes Based on Exit Functions*, IEEE Transactions on Communications, vol. 54, No. 8, Aug. 2006.

Shin, D. et al., *A Stopping Criterion for Low-Density Parity-Check Codes*, Vehicular Technology Conference, 2007, VTC2007-Spring, IEEE 65th Apr. 2007, 1529-1533.

Ueng, Y. et al., *A Fast-Convergence Decoding Method and Memory-Efficient VLSI Decoder Architecture for Irregular LDPC Codes in the IEEE 802.16e Standards*, IEEE (2007) 1255-1259.

Yeong, L., *A Fast-Convergence Decoding Method and Memory-Efficient VLSI Decoder Architecture for Irregular LDPC Codes in the IEEE 802, 16e Standards*, 2007, IEE, p. 1256.

Zhou, W. et al., *Early Stopping for the Iterative Decoding for Q-LDPC*, The Journal of China Universities of Posts and Telecommunications, vol. 15, Issue 1, Mar. 2008, pp. 1, 29, 30, 31.

International Search Report and Written Opinion for Application No. PCT/IB2009/052204 dated Aug. 5, 2009.

International Preliminary Report on patentability for Application No. PCT/IB2009/052204 dated Jan. 5, 2011.

Office Action for European Application No. 09 769 693.4 dated Mar. 7, 2012.

Office Action for U.S. Appl. No. 12/469,790 dated Aug. 2, 2012.

Notice of Allowance for U.S. Appl. No. 12/646,995 dated Oct. 1, 2012.

Office Action for U.S. Appl. No. 12/469,790; dated Nov. 21, 2013.

Kang, J., et al.; "*A Two-Stage Iterative Decoding of LDPC Codes for Lowering Error Floors;*" Global Telecommunications Conference; dated 2008; retrieved on Jan. 10, 2014 from <https://www.researchgate.net/publication/221285092_A_Two-Stage_Iterative_Decoding_of_LDPC_Codes_for_Lowering_Error_Floors?ev=srch_pub>.

Pearl, J.; "*Probabilistic Reasoning in Intelligent Systems;*" 1998; abstract retrieved on Jan. 10, 2014 from <http://dl.acm.org/citation.cfm?id=534975>.

Sharon, E., et al.; "*EXIT functions for binary input memoryless symmetric channels;*" IEEE Transactions on Communication, vol. 54; pp. 1207-1214; dated Jul. 2006; retrieved on Jan. 10, 2014 from <http://ect.bell-labs.com/who/aea/MyPapers/EXITpaper1_final.pdf>.

"*Joint probability distribution;*" Wikipedia; retrieved on Aug. 24, 2009 from <http://en.wikipedia.org/wiki/Joint_distribution>.

"*Marginal distribution;*" Wikipedia; retrieved on Aug. 24, 2009 from <http://en.wikipedia.org/wiki/Marginal_probability>.

"*Mutual information;*" Wikipedia; retrieved on Aug. 24, 2009 from <http://en.wikipedia.org/wiki/Mutual_information>.

Office Action for Japanese Application No. 2011-515675; dated Jul. 5, 2013.

Office Action for Japanese Application No. 2011-515675; dated Mar. 6, 2014.

Office Action for U.S. Appl. No. 12/469,790 dated Jun. 5, 2014.

\* cited by examiner

Initialization:
for all $c \in C, v \in N(c,G)$    $R_{cv} \leftarrow 0$

Iteration:
for all $v \in V$    (Compute bit to check messages)
    for all $c \in N(v,G)$
$$Q_{vc} \leftarrow P_v + \sum_{c' \in N(v,G) \setminus c} R_{c'v}$$
    end of loop
end of loop
for all $c \in C$    (Compute check to bit messages)
    for all $v \in N(c,G)$
$$R_{cv} \leftarrow \varphi^{-1}\left(\sum_{v' \in N(c,G) \setminus v} \varphi(Q_{v'c})\right)$$
    end of loop
end of loop
for all $v \in V$    (update final bit estimates)
$$Q_v \leftarrow P_v + \sum_{c \in N(v,G)} R_{cv}$$
end of loop

Stop Criteria:
for all $v \in V$ $\hat{v} = sign(Q_v)$
*if* $H \cdot \underline{\hat{v}} = 0$, stop
*else, continue to next iteration*

FIGURE 2 (PRIOR ART)

Initialization:
for all $v \in V, c \in C \quad R_{cv} \leftarrow 0$
for all $v \in V \quad Q_v \leftarrow P_v$

Iteration:
for all $c \in C$                                (Serially traversing the check nodes)
$$S \leftarrow \sum_{v \in N(c,G)} \varphi(Q_v - R_{cv})$$
   for all $v \in N(c,G)$
      $Q_{vc} \leftarrow Q_v - R_{cv}$              (Sending $Q_{vc}$ messages into the check nodes)
      $R_{cv} \leftarrow \varphi^{-1}(S - \varphi(Q_{vc}))$   (Sending $R_{cv}$ messages out from the check nodes)
      $Q_v \leftarrow Q_{vc} + R_{cv}$              (updating *a - posteriori* LLRs)
   end of loop
end of loop

Stop Criteria:
for all $v \in V \;\; \hat{v} = sign(Q_v)$
*if* $H \cdot \hat{v} = 0$, stop
*else, continue to next iteration*

FIGURE 3 (PRIOR ART)

Decoding phases:

for all $c \in C_J, v \in N(c,G)$: $Q_{vc} = P_v$ for all $i \in \{1,...,t\}$: (go over sub-graphs)

Sub-graph initialization:
    for all $v \in V_i, c \in C_i$:    $R_{cv} \leftarrow 0$
    for all $v \in V_i$:            $Q_v \leftarrow P_v = function(y_v)$
    for all $v \in V_i, c \in C_J$:    $R_{cv} \leftarrow \varphi^{-1}\left(\sum_{v' \in N(c,G)\backslash v} \varphi(Q_{v'c})\right)$ (exchange inter sub-graph information)

Sub-graph (i) iterations:
        for all $c \in C_i$: (go over sub-graph check nodes)
            Check node processing (send messages to and from check node):
$$S \leftarrow \sum_{v \in N(c,G_i)} \varphi(Q_v - R_{cv})$$
            for all $v \in N(c,G_i)$:
                $Q_{temp} \leftarrow Q_v - R_{cv}$
                $R_{cv} \leftarrow \varphi^{-1}\left(S - \varphi(Q_{temp})\right)$
                $Q_v \leftarrow Q_{temp} + R_{cv}$
            end of loop
        end of check nodes loop
    end of iteration loop
    Sub-Graph Stop Criteria:
    for all $v \in V_i$: $\hat{v} = sign(Q_v)$
    if $H_i \cdot \hat{v} = 0$ or maximal number of iterations is reached, stop
    $H_i$ ☐ the parity-check matrix corresponding to sub-graph $G_i$
    else, continue to next iteration
    Sub-graph termination:
    for all $v \in V_i, c \in C_J$:    $Q_{vc} \leftarrow P_v + \sum_{c' \in N(v,G)\backslash c} R_{c'v}$ (exchange inter sub-graph information)
end of sub-graphs loop

Stop Criteria:
for all $v \in V$ $\hat{v} = sign(Q_v)$
if $H \cdot \hat{v} = 0$ or maximal number of phases, then stop
$H$ ☐ the parity-check matrix corresponding to graph $G$
else, continue to next phase
end of phases loop

FIGURE 6

INTERRUPTION CRITERIA FOR BLOCK DECODING

This application is a divisional of U.S. patent application Ser. No. 12/646,995, filed Dec. 24, 2009, which is a continuation-in-part of U.S. patent application Ser. No. 12/469,790, filed May 21, 2009, that claims the benefit of U.S. Provisional Patent Application No. 61/074,701, filed Jun. 23, 2008.

FIELD AND BACKGROUND OF THE INVENTION

Disclosed herein is a method of iterative block decoding, for example Low-Density Parity Check (LDPC) decoding, that uses innovative interruption criteria, and associated devices.

Error Correction Codes (ECCs) are commonly used in communication systems and in storage systems. Various physical phenomena occurring both in communication channels and in storage devices result in noise effects that corrupt the communicated or stored information. Error correction coding schemes can be used for protecting the communicated or stored information against the resulting errors. This is done by encoding the information before transmission through the communication channel or storage in the memory device. The encoding process transforms the information bits sequence into a codeword by adding redundancy to the information. This redundancy can then be used in order to recover the information from the possibly corrupted codeword through a decoding process.

In both communication systems and storage systems an information bit sequence $\underline{i}$ is encoded into a coded bit sequence $\underline{v}$ that is modulated or mapped into a sequence of symbols $\underline{x}$ that is adapted to the communication channel or to the memory device. At the output of the communication channel or memory device a sequence of symbols $\underline{y}$ is obtained. An ECC decoder of the system decodes the sequence $\underline{y}$ and recovers the bit sequence $\underline{\hat{i}}$, which should reconstruct the original information bit sequence $\underline{i}$ with high probability.

A common ECC family is the family of linear binary block codes. A length N linear binary block code of dimension K is a linear mapping of length K information bit sequences into length N codewords, where N>K. The rate of the code is defined as R=K/N. The encoding process of a codeword $\underline{v}$ of dimension 1×N is usually done by multiplying the information bits sequence $\underline{i}$ of dimension 1×K by a generator matrix G of dimension K×N according to $$\underline{v}=\underline{i}\cdot G \quad (1)$$

It is also customary to define a parity-check matrix H of dimension M×N, where M=N−K. The parity-check matrix is related to the generator matrix through the following equation:

$$GH^T=\underline{0} \quad (2)$$

The parity-check matrix can be used in order to check whether a length N binary vector is a valid codeword. A 1×N binary vector $\underline{v}$ belongs to the code if and only if the following equation holds:

$$H\cdot\underline{v}'=\underline{0} \quad (3)$$

(In equation (3), the prime on $\underline{v}'$ means that $\underline{v}'$ is a column vector.)

In recent years iterative coding schemes have become very popular. In these schemes the code is constructed as a concatenation of several simple constituent codes and is decoded using an iterative decoding algorithm by exchanging information between the constituent decoders of the simple codes. Usually, the code can be defined using a bipartite graph describing the interconnections between the constituent codes. In this case, decoding can be viewed as an iterative message passing over the graph edges.

A popular class of iterative codes is Low-Density Parity-Check (LDPC) codes. An LDPC code is a linear binary block code defined by a sparse parity-check matrix H. As shown in FIG. 1, the code can be defined equivalently by a sparse bipartite graph G=(V, C, E) (also called a "Tanner graph") with a set V of N bit nodes (N=13 in FIG. 1), a set C of M check nodes (M=10 in FIG. 1) and a set E of edges (E=38 in FIG. 1) connecting bit nodes to check nodes. The bit nodes correspond to the codeword bits and the check nodes correspond to parity-check constraints on the bits. A bit node is connected by edges to the check nodes that the bit node participates with. In the matrix representation of the code on the left side of FIG. 1 an edge connecting bit node i with check node j is depicted by a non-zero matrix element at the intersection of row j and column i.

Next to the first and last check nodes of FIG. 1 are shown the equivalent rows of equation (3). The symbol "⊕" means "XOR".

LDPC codes can be decoded using iterative message passing decoding algorithms. These algorithms operate by exchanging messages between bit nodes and check nodes along the edges of the underlying bipartite graph that represents the code. The decoder is provided with initial estimates of the codeword bits (based on the communication channel output or based on the read memory content). These initial estimates are refined and improved by imposing the parity-check constraints that the bits should satisfy as a valid codeword (according to equation (3)). This is done by exchanging information between the bit nodes representing the codeword bits and the check nodes representing parity-check constraints on the codeword bits, using the messages that are passed along the graph edges.

In iterative decoding algorithms, it is common to utilize "soft" bit estimations, which convey both the bit estimations and the reliabilities of the hit estimations.

The bit estimations conveyed by the messages passed along the graph edges can be expressed in various forms. A common measure for expressing a "soft" bit estimation is as a Log-Likelihood Ratio (LLR)

$$\log\frac{Pr(v=0\mid\text{current constraints and observations})}{Pr(v=1\mid\text{current constraints and observations})},$$

where the "current constraints and observations" are the various parity-check constraints taken into account in computing the message at hand and the observations $\underline{y}$ corresponding to the bits participating in these parity checks. Without loss of generality, for simplicity we assume hereinafter that LLR messages are used throughout. The sign of the LLR provides the bit estimation (i.e., positive LLR corresponds to v=0 and negative LLR corresponds to v=1). The magnitude of the LLR provides the reliability of the estimation (i.e., |LLR|=0 means that the estimation is completely unreliable and |LLR|±∞ means that the estimation is completely reliable and the bit value is known).

Usually, the messages passed during the decoding along the graph edges between bit nodes and check nodes are extrinsic. An extrinsic message m passed from a node n on an edge e takes into account all the values received on edges connected to n other than edge e (this is why the message is called extrinsic: it is based only on new information).

One example of a message passing decoding algorithm is the Belief-Propagation (BP) algorithm, which is considered to be the best algorithm from among this family of message passing algorithms.

Let $$P_v = \log \frac{Pr(v = 0 \mid y)}{Pr(v = 1 \mid y)}$$

denote the initial decoder estimation for bit v, based only on the received or read symbol y. Note that it is also possible that some of the bits are not transmitted through the communication channel or stored in the memory device, hence there is no y observation for these bits. In this case, there are two possibilities: 1) shortened bits—the bits are known a-priori and $P_v \pm \infty$ (depending on whether the bit is 0 or 1). 2) punctured bits—the bits are unknown a-priori and $$P_v = \log \frac{Pr(v = 0)}{Pr(v = 1)},$$

where Pr(v=0) and Pr(v=1) are the a-priori probabilities that the bit v is 0 or 1 respectively. Assuming the information bits have equal a-priori probabilities to be 0 or 1 and assuming the code is linear then.

$$P_v = \log \frac{1/2}{1/2} = 0.$$

Let $$Q_v = \log \frac{Pr(v = 0 \mid \underline{y}, H \cdot \underline{v} = 0)}{Pr(v = 1 \mid \underline{y}, H \cdot \underline{v} = 0)}$$

denote the final decoder estimation for bit v, based on the entire received or read sequence $\underline{y}$ and assuming that bit v is part of a codeword (i.e., assuming $H \cdot \underline{v}=0$).

Let $Q_{vc}$ denote a message from bit node v to check node c. Let $R_{cv}$ denote a message from check node c to bit node v. The BP algorithm utilizes the following update rules for computing the messages:

The bit node to check node computation rule is:

$$Q_{vc} = P_v + \sum_{c' \in N(v,G) \backslash c} R_{c'v} \quad (4)$$

Here, N(n,G) denotes the set of neighbors of a node n in the graph G and $c' \in N(v,G) \backslash c$ refers to those neighbors excluding node 'c' (the summation is over all neighbors except c).

The check node to bit node computation rule is:

$$R_{cv} = \varphi^{-1} \left( \sum_{v' \in N(c,G) \backslash v} \varphi(Q_{v'c}) \right) \quad (5)$$

Here, $$\varphi(x) = \left\{ \text{sign}(x), -\log\tanh\left(\frac{|x|}{2}\right) \right\}$$

and operations in the φ domain are done over the group $\{0,1\} \times R^+$ (this basically means that the summation here is defined as summation over the magnitudes and XOR over the signs). Analogous to the notation of equation (4), N(c,G) denotes the set of bit node neighbors of a check node c in the graph G and $v' \in N(c,G) \backslash v$ refers to those neighbors excluding node 'v' (the summation is over all neighbors except v).

The final decoder estimation for bit v is:

$$Q_v = P_v + \sum_{c' \in N(v,G)} R_{c'v} \quad (6)$$

The order of passing messages during message passing decoding is called the decoding schedule. BP decoding does not imply utilizing a specific schedule—it only defines the computation rules (equations (4), (5) and (6)). The decoding schedule does not affect the expected error correction capability of the code. However, the decoding schedule can significantly influence the convergence rate of the decoder and the complexity of the decoder.

The standard message-passing schedule for decoding LDPC code is the flooding schedule, in which in each iteration all the variable nodes, and subsequently all the check nodes, pass new messages to their neighbors (R. G. Gallager, *Low-Density Parity-Check Codes*, Cambridge, Mass.: MIT Press 1963). The standard BP algorithm based on the flooding schedule is given in FIG. 2.

The standard implementation of the BP algorithm based on the flooding schedule is expensive in terms of memory requirements. We need to store a total of 2|V|+2|E| messages (for storing the $P_v$, $Q_v$, $Q_{vc}$, and $R_{cv}$ messages). Moreover, the flooding schedule exhibits a low convergence rate and hence requires higher decoding logic (e.g., more processors on an ASIC) for providing a required error correction capability at a given decoding throughput.

More efficient, serial message passing decoding schedules, are known. In a serial message passing schedule, the bit or check nodes are serially traversed and for each node, the corresponding messages are sent into and out from the node. For example, a serial schedule can be implemented by serially traversing the check nodes in the graph in some order and for each check node c∈C the following messages are sent:
1. $Q_{vc}$ for each v∈N(c) (i.e., all $Q_{vc}$ messages into the node c)
2. $R_{cv}$ for each v∈N(c) (i.e., all $R_{cv}$ messages from node c)

Serial schedules, in contrast to the flooding schedule, enable immediate and faster propagation of information on the graph resulting in faster convergence (approximately two times faster). Moreover, serial schedule can be efficiently implemented with a significant reduction of memory requirements. This can be achieved by using the $Q_v$ messages and the $R_{cv}$ messages in order to compute the $Q_{vc}$ messages on the fly, thus avoiding the need to use an additional memory for storing the $Q_{vc}$ messages. This is done by expressing $Q_{vc}$ as $(Q_v - R_{cv})$ based on equations (4) and (6). Furthermore, the same memory as is initialized with the a-priori messages $P_v$ is used for storing the iteratively updated $Q_v$ a-posteriori messages. An additional reduction in memory requirements is obtained because in the serial schedule we only need to use the knowledge of N(c) ∀c∈C, while in the standard implementation of the flooding schedule we use both data structures N(c) ∀c∈C and N(v) ∀v∈V requiring twice as much memory for storing the code's graph structure. The serially scheduled decoding algorithm appears in FIG. 3.

To summarize, serial decoding schedules have the following advantages over the flooding schedule:
1) Serial decoding schedules speed up the convergence by a factor of 2 compared to the standard flooding schedule. This means that we need only half the decoder logic in order to provide a given error correction capability at a given to throughput, compared to a decoder based on the flooding schedule.
2) Serial decoding schedules provide a memory-efficient implementation of the decoder. A RAM for storing only |V|+|E| messages is needed (instead of for storing 2|V|+2|E| messages as in the standard flooding schedule). Half the ROM size for storing the code's graph structure is needed compared to the standard flooding schedule.
3) "On-the-fly" convergence testing can be implemented as part of the computations done during an iteration, allowing convergence detection during an iteration and decoding termination at any point. This can save on decoding time and energy consumption.

Iterative coding systems exhibit an undesired effect called error floor as shown in FIG. 4, where, below a certain "noise" level in the communication channel or in the memory device, the Block Error Rate (BER) at the output of the decoder starts to decrease much more slowly even though the "noise" that is responsible for the bit errors becomes smaller. This effect is problematic, especially in storage systems, where the required decoder output block error rate should be very small ($\sim 10^{-10}$). Note that in FIG. 4 the noise increases to the right.

It is well known that the error correction capability and the error floor of an iterative coding system improve as the code length increases (this is true for any ECC system, but especially for iterative coding systems, in which the error correction capability is rather poor at short code lengths).

While properly designed LDPC codes are very powerful, and can correct a large number of errors in a code word, a phenomenon known as "trapping sets" may cause the decoder to fail, and increase the error floor of the code, even though the number of incorrect bits may be very small and may be confined to certain regions in the graph. Trapping sets are not well defined for general LDPC codes, but have been described as: "These are sets with a relatively small number of variable nodes such that the induced sub-graph has only a small number of odd degree check nodes."

Trapping sets are related to the topology of the LDPC graph and to the specific decoding algorithm used, are hard to avoid and are hard to analyze.

Trapping sets are a problem in the field of storage since historically the reliability required from storage devices is relatively high, for example 1 bit error per $10^{14}$ stored bits. The result is that codes employed in memory device such as flash memory devices should exhibit low error floor, but trapping sets increase the error floor.

One known way of dealing with trapping sets is to decode a codeword in two phases. During the first phase, conventional iterative decoding is performed along the graph defined by the LDPC code. If a trapping set is suspected to exist, which prevents the decoding process from converging to a legal codeword (i.e., a codeword that satisfies all the parity equations), then the conventional iterative decoding is interrupted and the second phase of the decoding is entered. In the second phase, some of the values associated with the nodes of the graph of the code are modified. For example, the values of the check node messages $R_{cv}$ may be reset to zero, or the magnitudes of the soft values $Q_v$ corresponding to bit probabilities may be truncated to no more than a predetermined value, typically a value between 10 and 16.

In multi-phase decoding scenarios, if the decoder of one phase fails to converge, it would be useful to have a criterion for early interruption of the decoding, in order to transition to the next decoding phase, rather than waiting to perform some predefined large number of iterations before deciding to interrupt the decoding. Such a criterion would save time and power during the phase that fails by skipping most of the non-converging iterations.

DEFINITIONS

The methods described herein are applicable to correcting errors in data in at least two different circumstances. One circumstance is that in which data are retrieved from a storage medium. The other circumstance is that in which data are received from a transmission medium. Both a storage medium and a transmission medium are special cases of a "channel" that adds errors to the data. The concepts of "retrieving" and "receiving" data are generalized herein to the concept of "importing" data. Both "retrieving" data and "receiving" data are special cases of "importing" data from a channel.

Typical storage media to which the technology described below is applicable are nonvolatile memories such as flash memories.

The data that are decoded by the methods presented herein are a representation of a codeword. The data are only a "representation" of the codeword, and not the codeword itself, because the codeword might have been corrupted by noise in the channel before one of the methods is applied for decoding.

SUMMARY OF THE INVENTION

Because the existence of a trapping set implies that a small number of bits are failing to converge correctly, the likely existence of a trapping set may be identified, and the iterative decoding interrupted, if all but a small number of bits are stable during successive iterations of the decoding, or if a small number of parity check equations fail consistently while all other parity check equations are satisfied. These exemplary "interruption criteria", that suggest the existence of a trapping set, are generalized herein to cases of slow convergence or non-convergence that are not necessarily caused by trapping sets.

Although there is an incentive to use the serial scheduler built-in mechanism for convergence detection via the number of satisfied check equations in order to terminate or interrupt the decoding process in case the decoder is not likely to converge, for example if a trapping set is formed during the decoding operation, the innovative interruption criteria presented below are applicable to message passing schedules generally, including flooding schedules, and not just to serial schedules. For example, decoding interruption criteria that are based on properties of an integral number of iterations cal be applied to a flooding scheduler with the same efficiency as to a serial scheduler.

One embodiment provided herein is a method of decoding a representation of a codeword that encodes K information bits as N>K codeword bits, the method including: (a) importing the representation of the codeword from a channel; (b) in a plurality of decoding iterations, updating estimates of the codeword bits; and (c) interrupting the decoding iterations if an order-dependent interruption criterion is satisfied.

Another embodiment provided herein is a decoder for decoding a representation of a codeword that encodes K information bits as N>K codeword bits, including a processor for executing an algorithm for decoding the representation of the codeword by steps including: (a) in a plurality of decoding iterations, updating estimates of the codeword bits; and (b) interrupting the decoding iterations if an order-dependent interruption criterion is satisfied.

Another embodiment provided herein is a memory controller including: (a) an encoder for encoding K information bits as a codeword of N>K codeword bits; and (b) a decoder including a processor for executing an algorithm for decoding a representation of the codeword by steps including: (i) in a plurality of decoding iterations, updating estimates of the codeword bits, and (ii) interrupting the decoding iterations if an order-dependent interruption criterion is satisfied.

Another embodiment provided herein is a receiver including: (a) a demodulator for demodulating a message received from a communication channel, thereby producing a representation of a codeword that encodes K information bits as N>K codeword bits; and (b) a decoder including a processor for executing an algorithm for decoding the representation of the codeword by steps including: (i) in a plurality of decoding iterations, updating estimates of the codeword bits, and (ii) interrupting the decoding iterations if an order-dependent interruption criterion is satisfied.

Another embodiment provided herein is a communication system for transmitting and receiving a message, including: (a) a transmitter including: (i) an encoder for encoding K information bits of the message as a codeword of N>K codeword bits, and (ii) a modulator for transmitting the codeword via a communication channel as a modulated signal; and (b) a receiver including: (i) a demodulator for receiving the modulated signal from the communication channel and for demodulating the modulated signal, thereby producing a representation of the codeword, and (ii) a decoder including a processor for executing an algorithm for decoding the representation of the codeword by steps including: (A) in a plurality of decoding iterations, updating estimates of the codeword bits, and (B) interrupting the decoding iterations if an order-dependent interruption criterion is satisfied.

Another embodiment provided herein is a computer readable storage medium having computer readable code embodied on the computer readable storage medium, the computer readable code for decoding a representation of a codeword that encodes K information bits as N>K codeword bits, the computer readable code including: (a) program code for, in a plurality of decoding iterations, updating estimates of the codeword bits; and (b) program code for interrupting the decoding iterations if an order-dependent interruption criterion is satisfied.

Another embodiment provided herein is a method of decoding a representation of a codeword that encodes K information bits as N>K codeword bits, the method including: (a) importing the representation of the codeword from a channel; (b) in a plurality of decoding iterations, updating estimates of the codeword bits; and (c) interrupting the decoding iterations if an interruption criterion, that includes an estimate of mutual information between the codeword and a vector that is used in the decoding iterations, is satisfied.

Another embodiment provided herein is a decoder for decoding a representation of a codeword that encodes K information bits as N>K codeword bits, including a processor for executing an algorithm for decoding the representation of the codeword by steps including: (a) in a plurality of decoding iterations, updating estimates of the codeword bits; and (b) interrupting the decoding iterations if an interruption criterion, that includes an estimate of mutual information between the codeword and a vector that is used in the decoding iterations, is satisfied.

Another embodiment provided herein is a memory controller including: (a) an encoder for encoding K information bits as a codeword of N>K codeword bits; and (b) a decoder including a processor for executing an algorithm for decoding a representation of the codeword by steps including: (i) in a plurality of decoding iterations, updating estimates of the codeword bits, and (ii) interrupting the decoding iterations if an interruption criterion, that includes an estimate of mutual information between the codeword and a vector that is used in the decoding iterations, is satisfied.

Another embodiment provided herein is a receiver including: (a) a demodulator for demodulating a message received from a communication channel, thereby producing a representation of a codeword that encodes K information bits as N>K codeword bits; and (b) a decoder including a processor for executing an algorithm for decoding the representation of the codeword by steps including: (i) in a plurality of decoding iterations, updating estimates of the codeword bits, and (ii) interrupting the decoding iterations if an interruption criterion, that includes an estimate of mutual information between the codeword and a vector that is used in the decoding iterations, is satisfied.

Another embodiment provided herein is a communication system for transmitting and receiving a message, including: (a) a transmitter including: (i) an encoder for encoding K information bits of the message as a codeword of N>K codeword bits, and (ii) a modulator for transmitting the codeword via a communication channel as a modulated signal; and (b) a receiver including: (i) a demodulator for receiving the modulated signal from the communication channel and for demodulating the modulated signal, thereby producing a representation of the codeword, and (ii) a decoder including a processor for executing an algorithm for decoding the representation of the codeword by steps including: (A) in a plurality of decoding iterations, updating estimates of the codeword bits, and (B) interrupting the decoding iterations if an interruption criterion, that includes an estimate of mutual information between the codeword and a vector that is used in the decoding iterations, is satisfied.

Another embodiment provided herein is a computer readable storage medium having computer readable code embodied on the computer readable storage medium, the computer readable code for decoding a representation of a codeword that encodes K information bits as N>K codeword bits, the computer readable code including: (a) program code for, in a plurality of decoding iterations, updating estimates of the codeword bits; and (b) program code for interrupting the decoding iterations if an interruption criterion, that includes an estimate of mutual information between the codeword and a vector that is used in the decoding iterations, is satisfied.

Another embodiment provided herein is a method of decoding a representation of a codeword that has been encoded according to a code, including: (a) importing the representation of the codeword from a channel; (b) providing an iterative procedure for decoding the representation of the codeword; and (c) following at most one iteration of the iterative procedure, deciding, according to a criterion that depends on at least one parameter selected from the group consisting of a syndrome of the representation of the codeword, a degree of the code and a rate of the code, whether to modify the iterative procedure.

Another embodiment provided herein is a decoder for decoding a representation of a codeword that has been encoded according to a code, including a processor for executing an algorithm for deciding, following at most one iteration of an iterative procedure for decoding the representation of the codeword, and according to a criterion that depends on at least one parameter selected from the group consisting of a syndrome of the representation of the codeword, a degree of the code and a rat of the code, whether to modify the iterative procedure.

Another embodiment provided herein is a memory controller, for controlling a memory, including: (a) an encoder for encoding a plurality of bits as a codeword according to a code; and (b) a decoder including a processor for executing an algorithm for deciding, following at most one iteration of an iterative procedure for decoding a representation of the codeword, and according to a criterion that depends on at least one parameter selected from the group consisting of a syndrome of the representation of the codeword, a degree of the code, a rate of the code and a resolution with which the representation of the codeword is read from the memory, whether to modify the iterative procedure.

Another embodiment provided herein is a receiver including: (a) a demodulator for demodulating a message received from a communication channel, thereby producing a representation of a codeword that encodes a plurality of bits according to a code; and (b) a decoder including a processor for executing an algorithm for deciding, following at most one iteration of an iterative procedure for decoding the representation of the codeword, and according to a criterion that depends on at least one parameter selected from the group consisting of a syndrome of the representation of the codeword, a degree of the code and a rate of the code, whether to modify the iterative procedure.

Another embodiment provided herein is a communication system for transmitting and receiving a message, including: (a) a transmitter including: (i) an encoder for encoding a plurality of bits as a codeword according to a code, and (ii) a modulator for transmitting the codeword via a communication channel as a modulated signal; and (b) a receiver including: (i) a demodulator for receiving the modulated signal from the communication channel and for demodulating the modulated signal, thereby producing a representation of the codeword, and (ii) a decoder including a processor for executing an algorithm for deciding, following at most one iteration of an iterative procedure for decoding the representation of the codeword, and according to a criterion that depends on at least one parameter selected from the group consisting of a syndrome of the representation of the codeword, a degree of the code and a rate of the code, whether to modify the iterative procedure.

Another embodiment provided herein is a computer readable storage medium having computer readable code embodied on the computer readable storage medium, the computer readable code for decoding a representation of a codeword that encodes a plurality of bits according to a code, the computer readable code including program code for deciding, following at most one iteration of an iterative procedure for decoding the representation of the codeword, and according to a criterion that depends on at least one parameter selected from the group consisting of a syndrome of the representation of the codeword, a degree of the code and a rate of the code, whether to modify the iterative procedure.

Another embodiment provided herein is a method of decoding a representation of a codeword that has been encoded according to a code, including: (a) reading the representation of the codeword from a memory; (b) deciding, according to a criterion that depends on a degree of the code, whether and how to modify at least one parameter used in the reading; and (c) if the decision is to modify the at least one parameter: to modify the at least one parameter and to re-read the representation of the codeword using the at least one parameter as so modified.

Another embodiment provided herein is a memory controller for controlling a memory, including: (a) an encoder for encoding a plurality of bits as a codeword according to a code; (b) a decoder including a processor for executing an algorithm for deciding, according to a criterion that depends on a degree of the code, whether and how to modify at least one parameter that has been used to read a representation of the codeword from the memory; and (c) circuitry: (i) for reading the representation of the codeword from the memory, and (ii) if the decision is to modify the at least one parameter: (A) for modifying the at least one parameter in accordance with the decision, and (B) for re-reading the representation of the codeword from the memory using the at least one parameter as so modified.

Another embodiment provided herein is a memory device including: (a) a memory; and (b) a memory controller, for controlling the memory, including: (i) an encoder for encoding a plurality of bits as a codeword according to a code, (ii) a decoder including a processor for executing an algorithm for deciding, according to a criterion that depends on a degree of the code, whether and how to modify at least one parameter that has been used to read a representation of the codeword from the memory; and (iii) circuitry: (A) for reading the representation of the codeword from the memory, and (B) if the decision is to modify the at least one parameter: (I) for modifying the at least one parameter in accordance with the decision, and (II) for re-reading the representation of the codeword from the memory using the at least one parameter as so modified.

Another embodiment provided herein is a computer readable storage medium having computer readable code embodied on the computer readable storage medium, the computer readable code for decoding a representation, of a codeword that encodes a plurality of bits according to a code, that has been read from a memory, the computer readable code including program code for deciding, according to a criterion that depends on a degree of the code, whether and how to modify at least one parameter that has been used to read the representation of the codeword from the memory.

Two general methods are provided herein for decoding a representation, that has been imported from a channel, of a codeword that encodes K information bits as N>K codeword bits. Most embodiments of the methods are applicable to block codes generally, not to just message-passing codes (codes, such as LDPC codes, that typically are decoded by using message passing decoding algorithms). In both general methods, estimates of the codeword bits are updated in a plurality of decoding iterations. The decoding iterations are interrupted if an interruption criterion is satisfied.

According to the first general method, the interruption criterion is order-dependent. As defined below, an order-dependent interruption criterion is a criterion that distinguishes among vectors, such as syndrome vectors, whose elements have the same values but in different orders. This is in contrast to "order-independent" criteria that are defined below as criteria that inspect properties, of vectors that are involved in the decoding, that are independent of the order in which specific values of the vector elements appear in the vectors.

In message passing decoding algorithms used to decode codes such as LDPC codes, the updating includes, in a graph that includes N bit nodes and N−K check nodes, exchanging messages between the bit nodes and the check nodes. Preferably, the interrupting includes modifying at least one element of at least one vector, such as the vector of $Q_v$'s, the vector of $Q_{vc}$'s, and/or the vector of $R_{cv}$'s, that is associated with the decoding, and then resuming the decoding iterations. Also preferably, the interruption criterion includes that a norm of absolute values of LLR estimates of selected codeword bits fails to increase within a predetermined number of iterations. Most preferably, the method also includes partitioning at least a portion of the graph into a plurality of sub-graphs. At least a portion of the message exchange is effected separately within each sub-graph, and the selected codeword bits are codeword bits within one of the subgraphs.

Equivalently, in message passing decoding algorithms used to decode codes such as LDPC codes, the updating includes, in a parity check matrix that includes N–K rows and N columns, exchanging messages between the rows and the columns. Preferably, the interrupting includes modifying at least one element of at least one vector, such as the vector of $Q_v$'s, the vector of $Q_{vc}$'s, and/or the vector of $R_{cv}$'s, that is associated with the decoding, and then resuming the decoding iterations. Also preferably, the interruption criterion includes that a norm of absolute values of LLR estimates of selected codeword bits fails to increase within a predetermined number of iterations. Most preferably, the method also includes partitioning at least a portion of the parity check matrix into a plurality of sub-matrices. At least a portion of the message exchange is effected separately within each sub-matrix, and the selected codeword bits are codeword bits within one of the sub-matrices.

Alternatively, the interrupting consists of terminating the decoding iterations.

One preferred order-dependent interruption criterion includes the failure of a norm of absolute values of LLR estimates of selected estimated codeword bits failing to increase within a predetermined number of iterations. Most preferably, the selected estimated codeword bits are estimated codeword bits that contribute to non-zero elements of the syndrome, i.e., estimated codeword bits that correspond to 1's in rows of the parity check matrix that correspond to non-zero elements of the syndrome.

Another preferred order-dependent interruption criterion includes that the numbers of zero elements in runs of consecutive zero elements of the syndrome do not tend to increase, either within one decoding iteration or across the border between two decoding iterations.

Another preferred order-dependent interruption criterion includes that the largest number of consecutive zero elements of the syndrome does not increase from one decoding iteration to the next.

Another preferred order-dependent interruption criterion includes that the largest number of consecutive zero elements of the syndrome does not increase monotonically across a pre-determined number (at least three) of consecutive decoding iterations.

According to the second general method, the interruption criterion includes an estimate of mutual information between the codeword and a vector that is used in the decoding iterations.

In message passing decoding algorithms used to decode codes such as LDPC codes, the updating includes, in a graph that includes N bit nodes and N–K check nodes, exchanging messages between the bit nodes and the check nodes. Preferably, the interrupting includes modifying at least one element of at least one vector (possibly but not necessarily the vector used in the interruption criterion), such as the vector of $Q_v$'s, the vector of $Q_{vc}$'s, and/or the vector of $R_{cv}$'s, that is associated with the decoding, and then resuming the decoding iterations. Most preferably, the vector, the estimate of mutual information between which and the codeword is included in the interruption criterion, is a vector of LLR estimates Q of the codeword bits, and the estimate of mutual information is $$\frac{1}{E}\sum 1 - \log_2(1 + e^{-|Q|}),$$

where E is the number of edges in the graph.

Equivalently, in message passing decoding algorithms used to decode codes such as LDPC codes, the updating includes, in a parity check matrix that includes N–K rows and N columns, exchanging messages between the rows and the columns. Preferably, the interrupting includes modifying at least one element of at least one vector (possibly but not necessarily the vector used in the interruption criterion), such as the vector of $Q_v$'s, the vector of $Q_{vc}$'s, and/or the vector of $R_{cv}$'s, that is associated with the decoding, and then resuming the decoding iterations.

Alternatively, the interrupting consists of terminating the decoding iterations.

A decoder corresponding to one of the two general methods includes one or more processors for decoding the representation of the codeword by executing an algorithm for updating the codeword bit estimates according to the corresponding general method.

A memory controller corresponding to one of the two general methods includes an encoder for encoding K information bits as a codeword of N>K bits and a decoder that corresponds to the general method. Normally, such a memory controller includes circuitry for storing at least a portion of the codeword in a memory and for retrieving a (possibly noisy) representation of the at least portion of the codeword from the memory. A memory device corresponding to one of the two general methods includes such a memory controller and also includes the memory.

A receiver corresponding to one of the two general methods includes a demodulator for demodulating a message received from a communication channel. The demodulator provides a representation of a codeword that encodes K information bits as N>K codeword bits. Such a receiver also includes a decoder that corresponds to the general method.

A communication system corresponding to one of the two general methods includes a transmitter and a receiver. The transmitter includes an encoder for encoding K information bits of a message as a codeword of N>K codeword bits and a modulator for transmitting the codeword via a communication channel as a modulated signal. The receiver is a receiver that corresponds to the general method.

A computer-readable storage medium corresponding to one of the two general methods has computer readable code embodied thereon for using the general method to decode a representation of a codeword that includes K information bits encoded as N>K codeword bits.

A third and a fourth general method are provided herein for decoding a representation of a codeword that has been encoded according to a code.

According to the third general method, the representation of the codeword is imported from a channel. An iterative procedure is provided for decoding the representation of the codeword. After only one iteration of the procedure, or even before effecting any iterations of the procedure, it is decided, according to a criterion that depends on one or more parameters selected from among the syndrome of the representation of the codeword (a vector parameter), a degree of the code (a scalar parameter) (in the case of a code such as a LDPC code the degree could be either the check node degree $d_c$ or the variable node degree $d_v$; in the preferred embodiments described below $d_c$ is used), the code rate (a scalar parameter) and (if the channel is a storage medium) the resolution with which the representation of the codeword is read from the channel (in general a vector parameter), whether to modify the iterative procedure before continuing. (The check node degree of a code such as a LDPC code is defined below as the number of "1"s in each row of the parity check matrix (or the average number of "1"s if the rows do not all have the same number of "1"s).)

Optionally, if the criterion depends on the syndrome, the criterion is order-independent.

Preferably, the criterion includes a bit error estimate. One preferred bit error estimate is $$q = \frac{1}{2} - \frac{1}{2}\left(1 - \frac{2W}{M}\right)^{1/\delta},$$

where M is the number of elements in the syndrome, W is the number of non-zero elements in the syndrome and δ is the relevant degree of the code (typically $\delta = d_c$ in the case of a code such as a LDPC code).

A decoder corresponding to the third general method includes one or more processors for implementing the decision step of the third general method.

A memory controller corresponding to the third general method includes an encoder for encoding a plurality of bits as a codeword according to a code and a decoder that corresponds to the third general method. Normally, such a memory controller also includes circuitry for storing at least a portion of the codeword in a memory and for retrieving a (possibly noisy) representation of the codeword from the memory. A memory device corresponding to the third general method includes such a memory controller and also includes the memory.

A receiver corresponding to the third general method includes a demodulator for demodulating a message received from a communication channel. The demodulator provides a representation of a codeword that encodes a plurality of bits according to a code. Such a receiver also includes a decoder that includes one or more processors for implementing the decision step of the third general method relative to the representation of the codeword.

A communication system corresponding to the third general method includes a transmitter and a receiver. The transmitter includes an encoder for encoding a plurality of bits as a codeword according to a code and a modulator for transmitting the codeword via a communication channel as a modulated signal. The receiver is a receiver that corresponds to the third general method.

A computer-readable storage medium corresponding to the third general method has computer readable code embodied thereon for implementing the decision step of the third general method.

According to the fourth general method, a representation of the codeword is read from a memory. It is decided, according to a criterion that depends on the degree of the code, whether and how to modify at least one parameter used in the reading of the representation of the codeword from the memory. If the decision is to modify the parameter(s) then the parameter(s) are modified and the representation of the codeword is re-read from the memory using the modified parameter(s).

Preferably, the memory is a flash memory and the parameter(s) is/are respective values of one or more reference voltages and/or a number of reference voltages.

Preferably, the criterion also depends on the syndrome of the representation of the codeword, in which case the criterion optionally is order-independent.

Preferably, the criterion includes a bit error estimate.

A memory controller corresponding to the fourth general method includes an encoder for encoding a plurality of bits as a codeword according to a code, and a decoder that includes one or more processors for implementing the decision step of the fourth general method. The memory controller also includes circuitry for reading the representation of the codeword from the memory and circuitry for modifying the reading parameter(s) and for re-reading the representation of the codeword from the memory using the modified reading parameter(s) if the decision is to modify the reading parameter(s). A memory device corresponding to the fourth general method includes such a memory controller and also the memory that the memory controller controls.

A computer-readable storage medium corresponding to the fourth general method has computer readable code embodied thereon for implementing the decision step of the fourth general method.

BRIEF DESCRIPTION OF THE DRAWINGS

Various embodiments are herein described, by way of example only, with reference to the accompanying drawings, wherein:

FIG. 2 shows a flooding schedule belief propagation algorithm;

FIG. 3 shows a conventional serial schedule belief propagation algorithm;

FIG. 6 shows a belief propagation algorithm in which messages are exchanged within sub-graphs and between the sub-graphs and a set of external check nodes;

DESCRIPTION OF THE PREFERRED EMBODIMENTS

Figure 1:
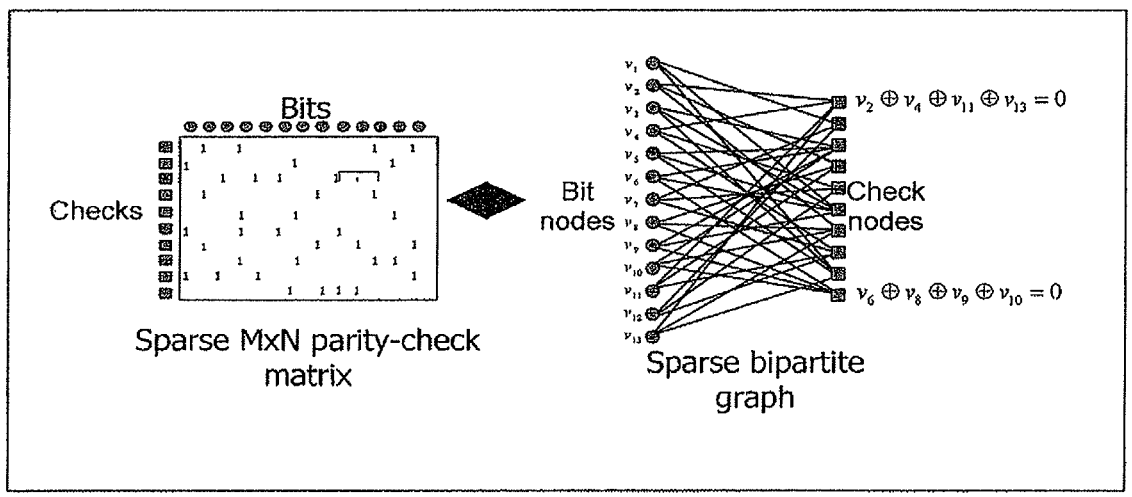
FIG. 1 shows how a LDPC code can be represented as either a sparse parity check matrix or a sparse bipartite graph.
Figure 4:
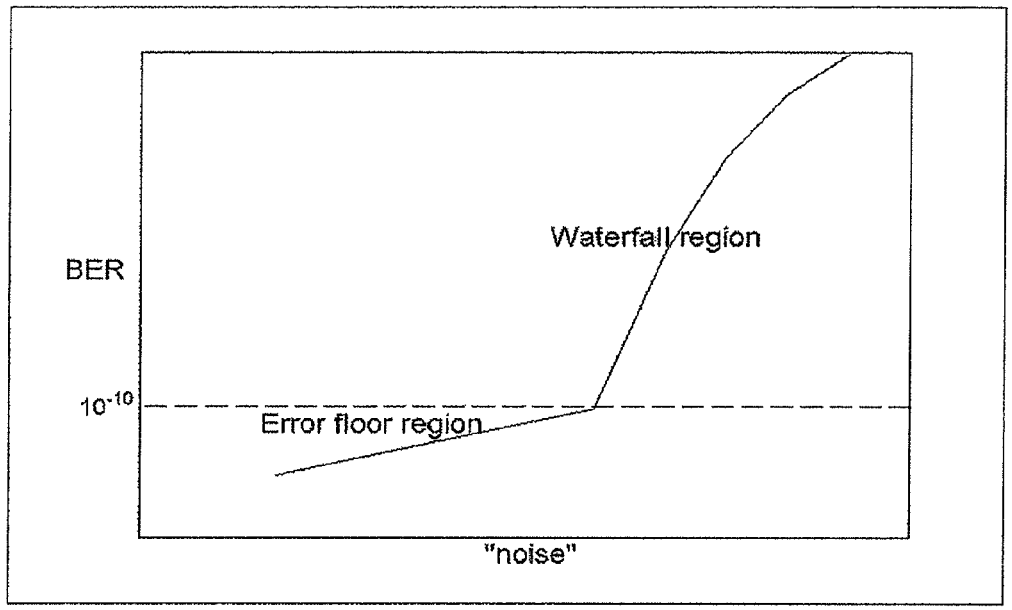
FIG. 4 illustrates error floor.

The principles and operation of low-complexity LPDC decoding and of LPDC decoding that overcomes persistent non-convergence such as non-convergence due to trapping sets may be better understood with reference to the drawings and the accompanying description.

In conventional decoders for LDPC codes, the memory required by the decoder is proportional to the code length N (equal to the number of variable nodes in the code's underlying graph |V|) and to the number of edges in the code's underlying graph |E|. In efficient implementations (e.g. based on serially scheduled decoders), the required memory can be as small as (|V|+|E|)*bpm bits, where |V| is the number of bit estimations, |E| is the number of edge messages and bpm is the number of bits per message stored in the memory of the decoder (note that we assume here that the same number of bits is required for storing bit estimation and edge message, for the sake of simplicity, though this is not necessarily the case). The decoder presented herein uses much smaller memory for implementing the decoding, storing only a small fraction of the |V| bit estimations and of the |E| edge messages simultaneously, without any degradation in decoder's error correction capability, compared to a conventional decoder, assuming sufficient decoding time is available. This is achieved by employing an appropriate decoding schedule and using the decoding hardware described herein.

The methods and decoders described herein operate by dividing the underlying graph representing the code into several sections and to implement the message passing decoding algorithm by sequentially processing the different sections of the graph, one or more sections at a time. At each stage during decoding only the bit estimations and edge messages corresponding to the graph section(s) that is/are currently being processed are stored. This way a very long LDPC code can be employed, providing near optimal error correction capability and very low error floor, while utilizing a low complexity decoding hardware.

The decoders presented herein are highly suitable for usage in memory devices, principally for the three following reasons:

1. A low ECC error floor is especially important in memory devices, which have severe decoder output BER requirements ($<10^{-15}$). When short codes are used, achieving such low error floor is very hard and usually requires sacrificing the error correction capability of the code, which is already compromised due to the short length of the code. Therefore using an equivalent long code the error correction capability of the code is improved, and thus lower ECC redundancy is required for protecting information against a given memory "noise" which corrupts the stored data. This in turn results in better cost efficiency of the memory, because a larger amount of information can be stored in a given number of memory cells (or using a given memory silicon size). Hence, employing a long ECC in memory devices is expected to provide a significant advantage.

2. The LDPC methods presented herein allow for processing a section of the code's underlying graph at each processing phase, instead of the entire graph at once. This means that we can store only a part of the "soft" bit estimations at each phase and not all of the "soft" bit estimations at once. Here the term "soft" bit estimates refers to a collection of bits describing the reliability of an estimate 'y' for each stored bit deduced from reading from the storage (possibly flash device).

This feature can be easily utilized in a memory device, because only the presently required bit observations (y) can be read from the storage device, hence there is no need for a large buffer in the memory controller in order to implement the ECC decoding. Alternatively, even if all bit observations (represented by the vector y) are read from the memory at once, the buffer required for storing them is usually much smaller than the memory required for storing the bit observations (the $P_v$ messages) required by the decoder. This way, only part of the soft bit estimates corresponding to the graph section that is currently being processed by the decoder are generated each time, resulting in a smaller decoder memory requirement.

Consider for example a SLC Flash memory device (a Flash memory device that stores one bit per cell; "SLC" means "Single Level Cell" and actually is a misnomer because each cell supports two levels; the "S" in "SLC" refers to there being only one programmed level.), in which each cell stores a single bit v and the state y read from each cell can be either 0 or 1. Then the memory needed for storing the vector y of read cell states is N bits. On the other hand, the memory required for storing all the soft bit estimates ($P_v$ messages) can be larger (for example 6N bits if each LLR estimate is stored in 6 bits). Hence, it is more efficient to generate only the required soft bit estimates in each decoder activation. A LLR bit estimate $$P_v = \log \frac{Pr(v=0|y)}{Pr(v=1|y)}$$

for some bit v can be generated from the corresponding bit observations y that are read from the flash memory device based on an a-priori knowledge of the memory "noise". In other words, by knowing the memory "noise" statistics we can deduce the probability that a bit v that was stored in a certain memory cell is 0/1 given that 'y' is read from the cell.

For example, assume that in a certain SLC Flash memory device the probability of reading the state of the cell different than the one it was programmed to is $p=10^{-2}$, then if y=0 then $$P_v = \log \frac{1-p}{p} = 4.6$$

and if y=1 then $$P_v = \log \frac{p}{1-p} = -4.6.$$

Furthermore, if the number of states that can be read from each cell of the flash device (represented by 'y') is 8 because the cell stores a single bit (one "hard bit") and the device is configured to read eight threshold voltage levels, equivalent to two 'soft bits', then each element 'y' which requires, in the controller, storage for 3 bits, is converted to an LLR value $P_v$ that may be represented as more than 3 bits, for example as 6 bits (BPM=Bits Per Message=6). These 6 bits are a soft bit estimate as opposed to the 2 soft bits read from the flash cell and corresponding to this 6-bit LLR value.

3. A decoding schedule of the type presented herein allow for a smaller memory requirement (compared with conventional decoding schedules). However, the decoding schedules presented herein might slow down the decoder convergence rate and increase the decoding time, especially when operating near the decoder's maximal error correction capability. Such a decoder is highly suitable for memory devices, which can tolerate variable ECC decoding latencies. For example, if the required decoding time for the ECC to converge to the correct stored codeword is long due to a high number of corrupted bits, then the memory controller can stop reading the memory until the decoding of the previously read codeword is finalized. Note that during most of a flash memory device's life, the memory "noise" is small and the number of corrupted bits is small. Hence, the decoder operates efficiently and quickly, allowing for an efficient pipelined memory reading. Rarely, the number of corrupted bits read from the memory is high, requiring longer decoding time and resulting in a reading pipeline stall. Therefore on average the throughput is left unharmed even with these variable decoding time characteristics.

According to one class of embodiments, the bipartite graph $G=(V, C, E)$ that represents the code is divided into several sections in the following way. 1) Divide the set V of bit nodes into t disjoint subsets: $V_1, V_2, \ldots, V_t$ (such that $V=V_1 \cup V_2 \cup \ldots \cup V_t$). 2) For each subset $V_i$ of bit nodes, form a subset $C_i$ of check nodes, including all of the check nodes that are connected solely to the bit nodes in $V_i$. 3) Form a subset $C_J$ of external check nodes, including all of the check nodes that are not in any of the check node subsets formed so far, i.e. $C_J = C \setminus (C_1 \cup C_2 \cup \ldots \cup C_t)$. 4) Divide the graph G into t sub-graphs $G_1, G_2, \ldots, G_t$ such that $G_i=(V_i, C_i, E_i)$ where $E_i$ is the set of edges connected between bit nodes in $V_i$ and check nodes in $C_i$. Denote the edges connected to the set $C_J$ by $E_J$ (note that $E_J = E \setminus (E_1 \cup E_2 \cup \ldots \cup E_t)$).

In these embodiments, the graph G is processed according to a special message passing schedule, by iteratively performing decoding phases, and in each decoding phase exchanging messages along the graph edges in the following order:

for i=1 through t

Figure 5:
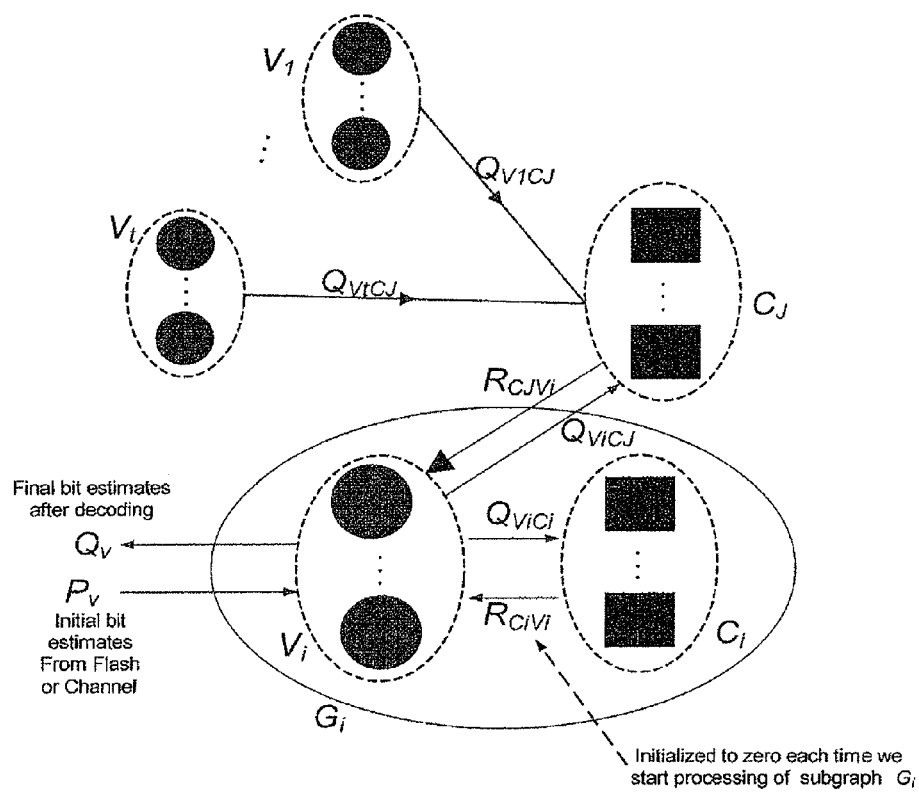
FIG. 5 shows how messages are exchanged within a sub-graph and between a sub-graph and a set of external check nodes.

Send $R_{cv}$ messages from check nodes $c \in C_J$ to bit nodes $v \in V_i$ along edges in $E_J$, depicted as the $R_{cJvi}$ messages in FIG. 5. Set $R_{cv}$ messages from check nodes $c \in C_i$ to bits nodes $v \in V_i$ to zero, depicted by the $Rc_iv_i$ messages in FIG. 5. Set initial bit estimations to $P_v$ for every bit $v \in V_i$, depicted as the $P_{vi}$ messages in FIG. 5. Note that the messages $R_{cJvi}$ are the result of activating the decoder for the other t−1 sub-graphs $G_k$, k≠i, prior to this step. In the event that other sub-graphs have not been processed yet, their corresponding messages $Q_{vic_J}$ in FIG. 5 are set to $P_{vi}$, i.e., the estimates read from the memory or received from the communication channel. In case those are punctured bits, their $P_{vi}$'s are zero.

2. Perform one or more iterations by sending $Q_{vc}$ messages from bit nodes in $V_i$ to check nodes in $C_i$, and $R_{cv}$ messages from check nodes in $C_i$ to bit nodes in $V_i$, along the edges in $E_i$, according to some schedule (e.g. according to the serial schedule described in FIG. 3, performed by serially traversing the check nodes in $C_i$ and for each check node sending the messages to and from that check node). This is depicted as the $Qv_ic_i$ and $Rc_iv_i$ messages in FIG. 5.

3. Send $Q_{vc}$ messages from bit nodes in $V_i$ to check nodes in $C_J$ along the edges in $E_J$, depicted as the $Qv_ic_J$ messages in FIG. 5.

Decoding continues until the decoder converges to a valid codeword, satisfying all the parity-check constraints, or until a maximum number of allowed decoding phases is reached. The stopping criterion for the message passing within each sub-graph i is similar: iterate until either all the parity-check constraints within this sub-graph are satisfied or a maximum number of allowed iterations is reached. In general, the maximum allowed number of iterations may change from one sub-graph to another or from one activation of the decoder to another.

The messages sent along the edges in $E_J$ (Ram messages and $Qv_ic_J$ messages in FIG. 5) are used for exchanging information between the different sections of the graph. The messages that are sent at each stage during decoding can be computed according to the standard computation rules of the message passing decoding algorithm. For example, if BP decoding is implemented then the messages are computed according to equations (4) and (5). Other message-passing decoding algorithms, such as Min Sum algorithms, Gallagher A algorithms and Gallagher B algorithms, have their own computation rules.

Such a decoding algorithm, assuming serially scheduled message passing decoding within each sub-graph, implementing BP decoding, is summarized in FIG. 6. In this algorithm, at each stage during decoding only the $Q_v$ messages corresponding to bit nodes $v \in V_i$, the $R_{cv}$ messages corresponding to the edges in $E_i$ and the messages corresponding to the edges in $E_J$ are stored. Hence, the decoder of this class of embodiments requires storing only (max $\{|V_1|, |V_2|, \ldots, |V_t|\}$+max $\{|E_1|, |E_2|, \ldots, |E_t|\}$+$|E_J|$) messages simultaneously, compared to ($|V|+|E|$) messages in efficient conventional decoders. Thus the memory requirement is ~1/t fraction of the memory required for a conventional decoder. When implementing long LDPC codes this provides a significant advantage in a decoder's complexity.

Figure 7A:
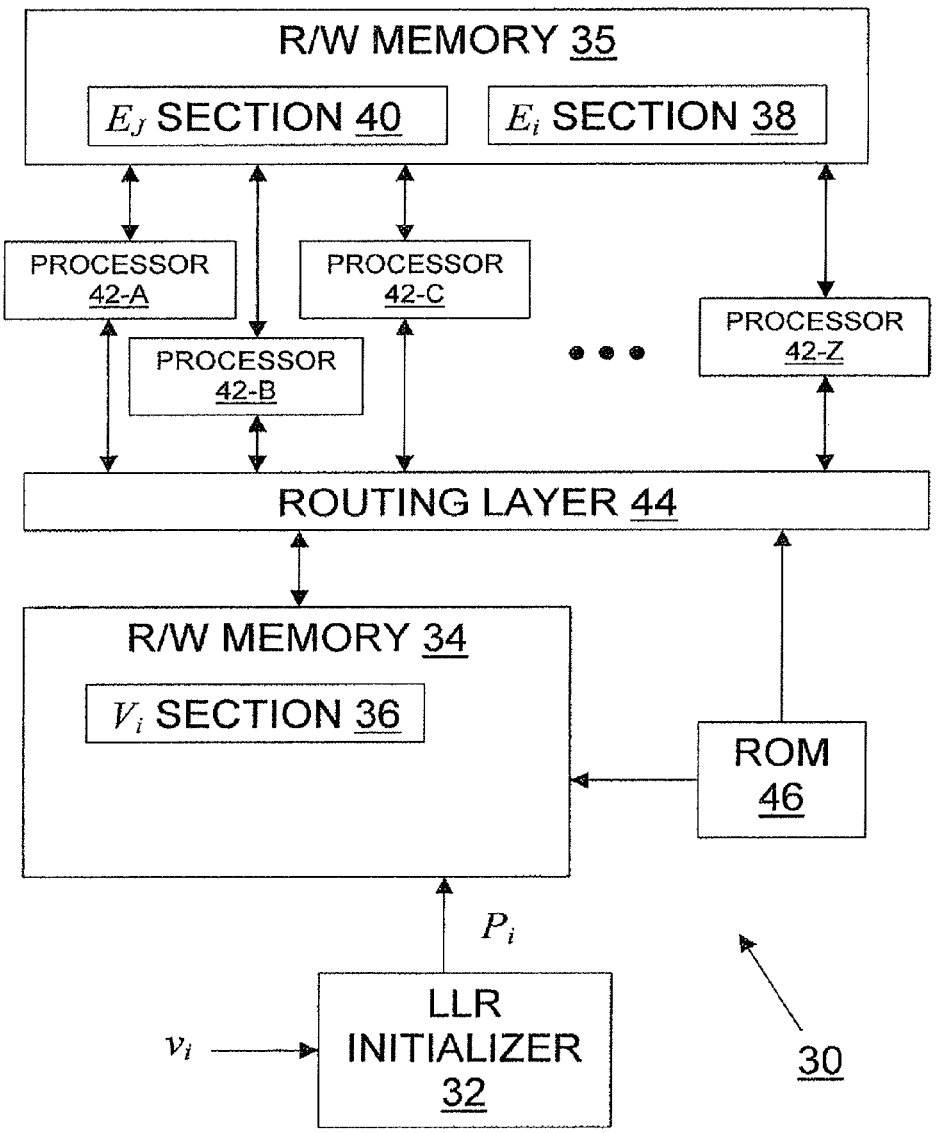
FIGS. 7A and 7B are high-level schematic block diagrams of decoders for implementing the algorithm of FIG. 6.

A high-level schematic block diagram of an exemplary decoder 30 according to this class of embodiments is shown in FIG. 7A. Decoder 30 includes:

1. An initial LLRs computation block 32 that computes the initial bit estimations $\underline{P_i}=[P_v:v \in V_i]$ for bits $v \in V_i$ in the currently processed sub-graph $G_i=(V_i, C_i, E_i)$, based on the corresponding bit observations $\underline{y_i}=[y_v:v \in V_i]$ read from the memory or received from the communication channel (where $y_v$ is the observation corresponding to bit v).

2. A read/write memory 34 including a memory section 36 for storing the bit estimations for bit nodes $v \in V_i$ in the currently processed sub-graph ($Q_i$ messages which are initialized as the $P_v$ messages).

3. A read/write memory 35 including:

3a. A memory section 38 for storing the $R_{cv}$ messages corresponding to the edge set $E_i$ of the currently processed sub-graph.

3b. A memory section 40 for storing the messages along the edges in $E_J$. Memory section 40 stores: i) the $Q_{vc}$ messages from bit nodes $v \in V_{i'}$ $\forall i' \in \{1, \ldots, n\} \setminus i$ to check nodes $c \in C_J$, where i is the index of the currently processed sub-graph; and ii) for bit nodes $v \in V_i$ memory section 40 first stores the $R_{cv}$ messages from check nodes $c \in C_J$ and afterwards the sub-graph's processing memory section 40 stores the $Q_{vc}$ to check nodes $c \in C_J$.

4. Processing units 42 for implementing the computations involved in updating the messages (as shown in FIG. 6).

5. A routing layer 44 that routes messages between memory 34 and processing units 42. For example, in some subclasses of this class of embodiments, within the loop over sub-graphs $G_1$ through $G_t$ in FIG. 6, routing layer 44 assigns each processor 42 its own check node of the current sub-graph $G_i$ and the check node processing is done in parallel for all the check nodes of $G_i$ (or for as many check nodes of $G_i$ as there are processors 42).

6. A read-only memory (ROM) 46 for storing the code's graph structure. Memory addressing, and switching by routing layer 44, are based on entries in ROM 46.

Decoder 30 includes a plurality of processing units 42 so that the computations involved in updating the messages may be effected in parallel. An alternative embodiment with only one processing unit 42 would not include a routing layer 44.

Figure 7B:
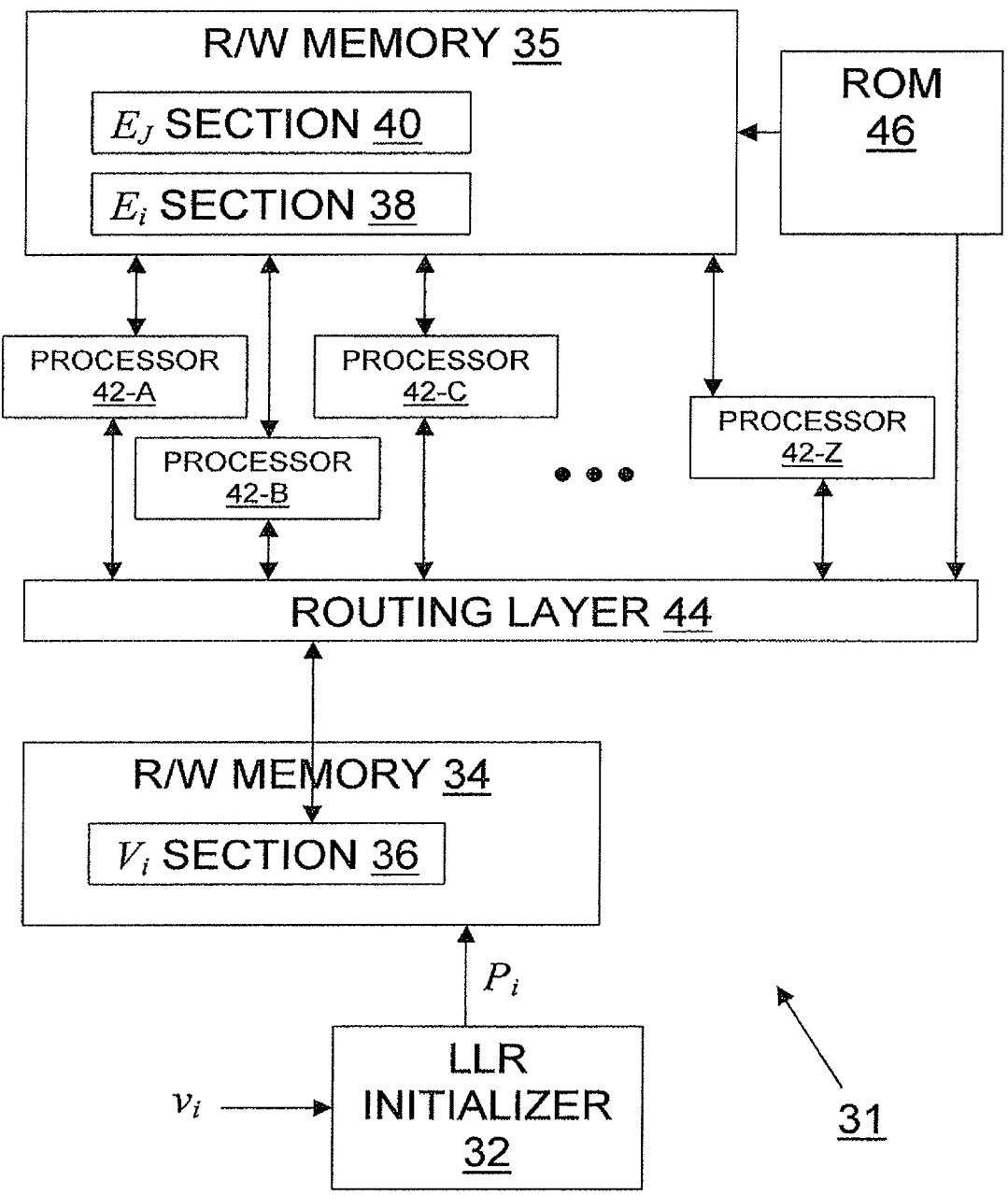

As noted above, a serial passing schedule traverses serially either the check nodes or the bit nodes. Decoder 30 of FIG. 7A traverses the check nodes serially. FIG. 7B is a high-level schematic block diagram of a similar decoder 31 that traverses the bit nodes serially.

Figure 8:
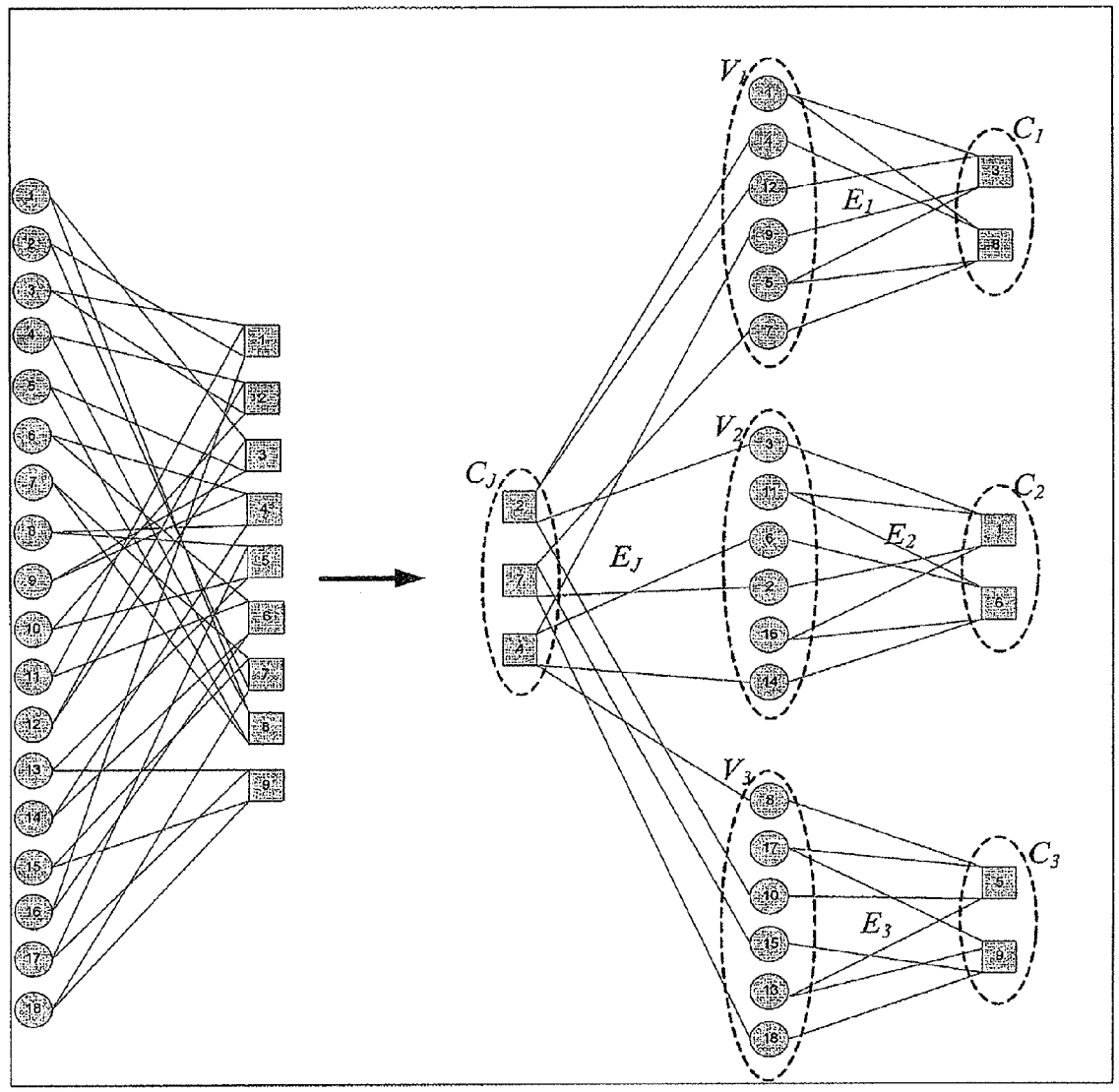
FIGS. 8 and 9 show two ways of partitioning the sparse bipartite graph of FIG. 1 into sub-graphs.

An example of the graph partitioning according to this class of embodiments is shown in FIG. 8. An LDPC code which is described by a regular bipartite graph with 18 bit nodes and 9 check nodes, such that every bit node is connected to two check nodes and every check node is connected to four bit nodes, is used in this example. This is a length 18, rate 1/2 LDPC code. The original graph is shown on the left side of FIG. 8. This also is the graph of FIG. 1. The graph after partitioning its bit nodes, check nodes and edges into subsets is shown on the right side of FIG. 8. Note that this is the same graph, only rearranged for sake of clarity. For this code, a prior art efficient decoder would require storing 18+36=54 messages, while the corresponding decoder 30 requires storing only 6+8+12=26 messages, providing 52% reduction in the decoder's memory complexity, while maintaining the same error correction capability.

It is preferred that all the sub-graphs be topologically identical, as in the example of FIG. 8. In this context, "topological identity" means that all the sub-graphs have equal numbers of bit nodes and equal numbers of check nodes; that each bit node has a corresponding bit node in every other sub-graph in terms of connectivity to internal check nodes; and that each sub-graph check node has a corresponding check node in every other sub-graph in terms of connectivity to bit nodes. For example, in FIG. 8:

Bit nodes 1, 5, 11, 13, 16 and 17 correspond because bit nodes 1 and 5 are connected to both check nodes of sub-graph 1, bit nodes 11 and 16 are connected to both check nodes of sub-graph 2, bit nodes 13 and 17 are connected to both check nodes of sub-graph 3, and none of these bit nodes is connected to an external check node (a check node of set $C_J$).

The remaining bit nodes correspond because each of these bit nodes is connected to one check node of the same sub-graph.

All the check nodes of the sub-graphs correspond because each one of these check nodes is connected to the two bit nodes of its sub-graph that are connected only to sub-graph check nodes and to two other bits of its sub-graph that are also connected to external check nodes.

Note that the sub-graphs need not have identical connectivity to the external check nodes in order to be "topologically identical". For example, the two bit nodes, 15 and 18, of sub-graph 3, that are connected to the same external check node 7, are also connected to the same check node 9 of sub-graph 3, but the two bit nodes, 4 and 12, of sub-graph 1, that are connected to the same external check node 2, are connected to different check nodes (3 and 8) of sub-graph 1.

If need be, however, any LDPC graph G can be partitioned into sub-graphs by a greedy algorithm. The first sub-graph is constructed by selecting an arbitrary set of bit nodes. The check nodes of the first sub-graph are the check nodes that connect only to those bit nodes. The second sub-graph is constructed by selecting an arbitrary set of bit nodes from among the remaining bit nodes. Preferably, of course, the number of bit nodes in the second sub-graph is the same as the number of bit nodes in the first sub-graph. Again, the check nodes of the second sub-graph are the check nodes that connect only to the bit nodes of the second sub-graph. This is arbitrary selection of bit nodes is repeated as many times as desired. The last sub-graph then consists of the bit nodes that were not selected and the check nodes that connect only to those bit nodes. The remaining check nodes constitute $C_J$.

Figure 9:
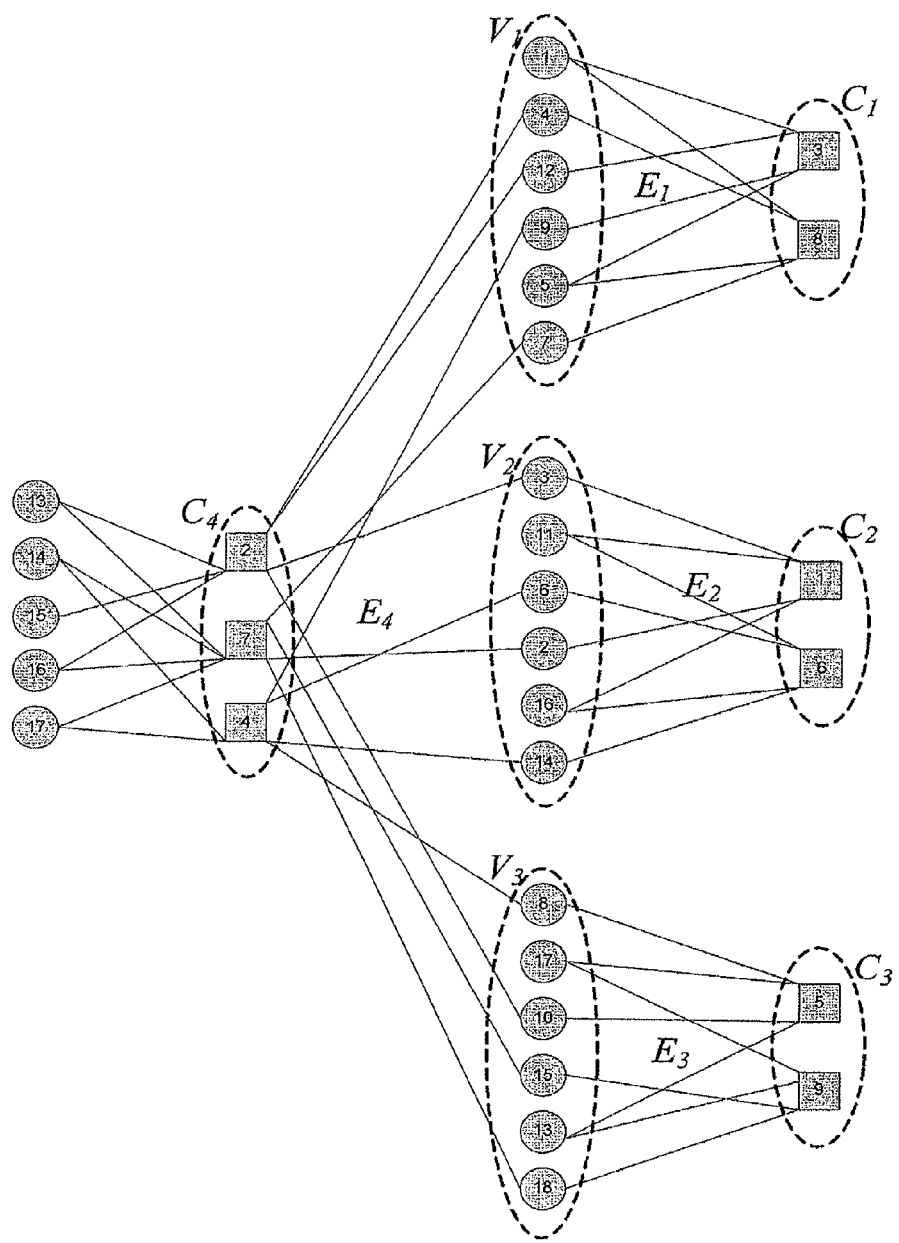

In the class of embodiments described above, the LDPC graph G is partitioned into t sub-graphs, each with its own bit nodes and check nodes, plus a separate subset $C_J$ of only check nodes. In another class of embodiments, as illustrated in FIG. 9, G is partitioned into just t sub-graphs, each with its own bit nodes and check nodes. For example, using the greedy algorithm described above, the last sub-graph ($G_t$) includes the non-selected bit nodes, the check nodes that connect only to these bit nodes, and also all the remaining check nodes. This is equivalent to the set $C_J$ of the first class of embodiments being connected to its own subset of bit nodes separate from the bit nodes of the sub-graphs. In this class of embodiments, the algorithm of FIG. 6 is modified by including only sub-graphs $G_1$ through $G_{t-1}$ in the sub-graphs loop and ending each decoding phase by following the sub-graphs loop with a separate exchange of messages exclusively within $G_t$. FIG. 9 shows the case of t=4. In one subclass of these embodiments, some of the bits are punctured bits, and $G_t$ is dedicated to these bits: all the bits of $G_t$ are punctured bits, and all the punctured bits are bits of $G_t$.

Figure 10:
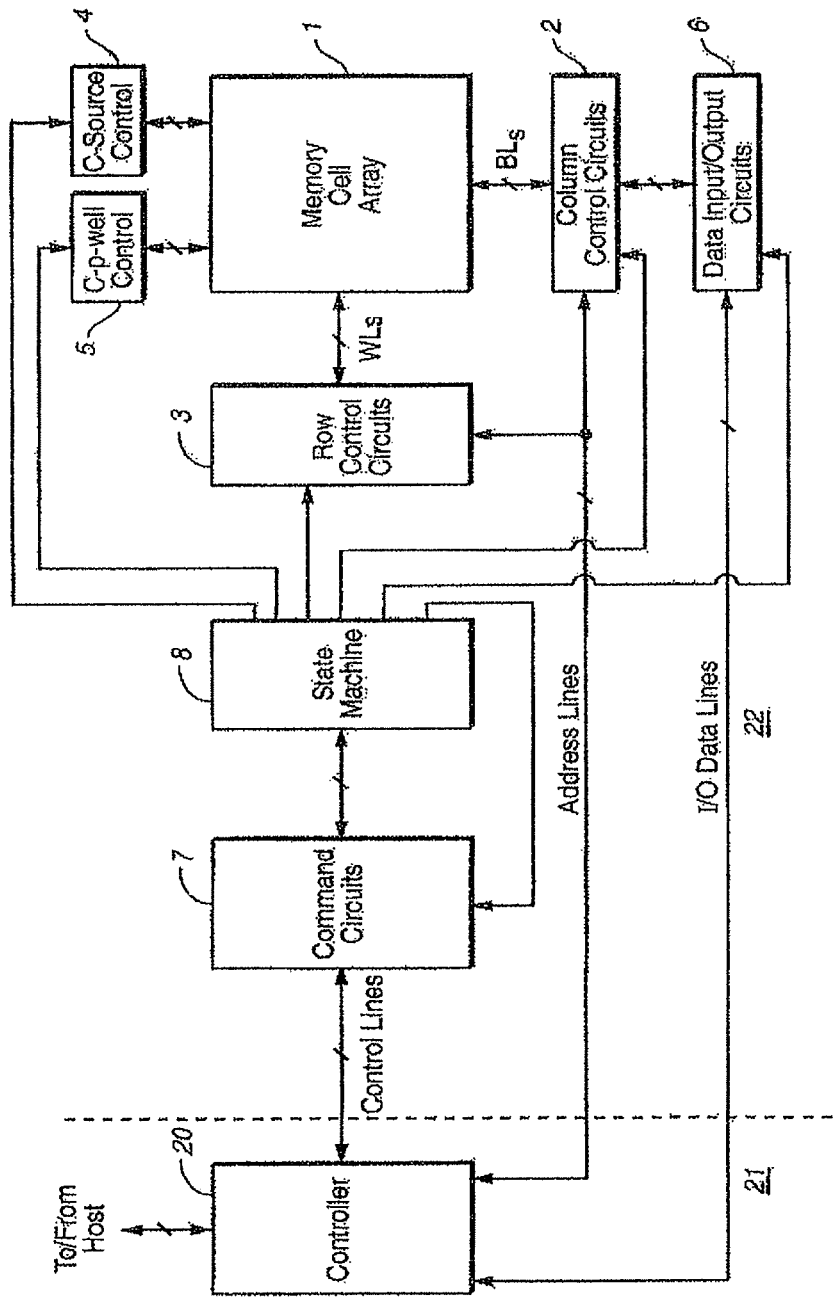
FIG. 10 is a high-level schematic block diagram of a flash memory device whose controller includes the decoder of FIG. 7A.

FIG. 10 is a high-level schematic block diagram of a flash memory device. A memory cell array 1 including a plurality of memory cells M arranged in a matrix is controlled by a column control circuit 2, a row control circuit 3, a c-source control circuit 4 and a c-p-well control circuit 5. Column control circuit 2 is connected to bit lines (BL) of memory cell array 1 for reading data stored in the memory cells (M), for determining a state of the memory cells (M) during a writing operation, and for controlling potential levels of the bit lines (BL) to promote the writing or to inhibit the writing. Row control circuit 3 is connected to word lines (WL) to select one of the word lines (WL), to apply read voltages, to apply writing voltages combined with the bit line potential levels controlled by column control circuit 2, and to apply an erase voltage coupled with a voltage of a p-type region on which the memory cells (M) are formed. C-source control circuit 4 controls a common source line connected to the memory cells (M). C-p-well control circuit 5 controls the c-p-well voltage.

The data stored in the memory cells (M) are read out by column control circuit 2 and are output to external I/O lines via an I/O line and a data input/output buffer 6. Program data to be stored in the memory cells are input to data input/output buffer 6 via the external I/O lines, and are transferred to column control circuit 2. The external I/O lines are connected to a controller 20.

Command data for controlling the flash memory device are input to a command interface connected to external control lines which are connected with controller 20. The command data inform the flash memory of what operation is requested. The input command is transferred to a state machine 8 that controls column control circuit 2, row control circuit 3, c-source control circuit 4, c-p-well control circuit 5 and data input/output buffer 6. State machine 8 can output a status data of the flash memory such as READY/BUSY or PASS/FAIL.

Controller 20 is connected or connectable with a host system such as a personal computer, a digital camera, a personal digital assistant. It is the host which initiates commands, such as to store or read data to or from the memory array 1, and provides or receives such data, respectively. Controller 20 converts such commands into command signals that can be interpreted and executed by command circuits 7. Controller 20 also typically contains buffer memory for the user data being written to or read from the memory array. A typical memory device includes one integrated circuit chip 21 that includes controller 20, and one or more integrated circuit chips 22 that each contain a memory array and associated control, input/output and state machine circuits. The trend, of course, is to integrate the memory array and controller circuits of such a device together on one or more integrated circuit chips. The memory device may be embedded as part of the host system, or may be included in a memory card that is removably insertable into a mating socket of host systems. Such a card may include the entire memory device, or the controller and memory array, with associated peripheral circuits, may be provided in separate cards.

Figure 11:
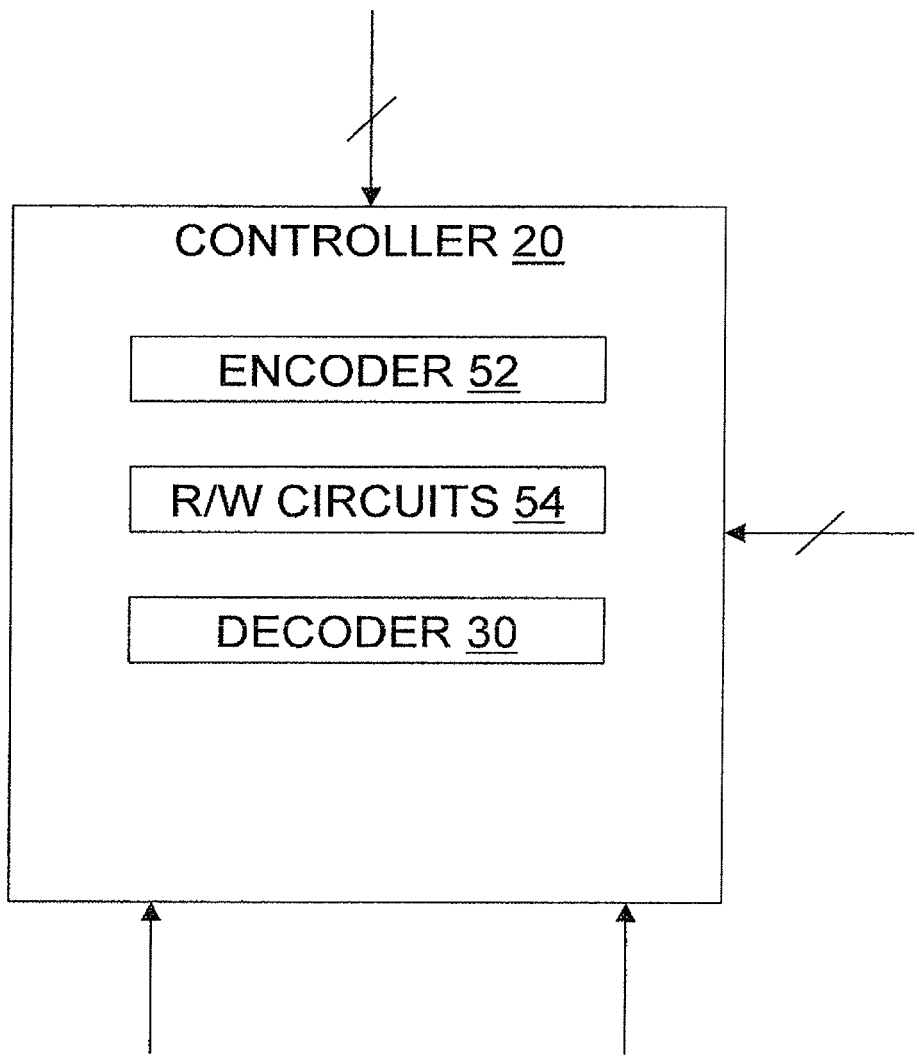
FIG. 11 is a detail of FIG. 10.

FIG. 11 is an enlarged view of part of FIG. 10, showing that controller 20 includes an encoder 52 for encoding user data received from the host as one or more codewords, circuitry 54 for instructing command circuits 7 to store the codewords (or only the non-punctured bits thereof, if any of the bits of the codewords are punctured bits) in memory cell array 1 and for instructing command circuits 7 to retrieving the stored codewords (or the stored portions thereof in the punctured bit case) from memory cell array 1, and decoder 30 for decoding the representation of the codewords as retrieved by circuitry 54. Alternatively, controller 20 could include decoder 31 instead of decoder 30.

Note that the location of the dashed vertical line in FIG. 10 that separates integrated circuit chips 21 and 22 is somewhat arbitrary. Command circuits 7 and state machine 8 could be fabricated together with controller 20 on integrated circuit chip 21, in which case the combination of controller 20, command circuits 7 and state machine 8 would be considered a memory controller for memory cell array 1 and the remaining control circuits 2, 3, 4, 5 and 6 on integrated circuit chip 22.

Although the methods and the decoders disclosed herein are intended primarily for use in data storage systems, these methods and decoders also are applicable to communications systems, particularly communications systems that rely on wave propagation through media that strongly attenuate high frequencies. Such communication is inherently slow and noisy. One example of such communication is radio wave communication between shore stations and submerged submarines.

Figure 12:
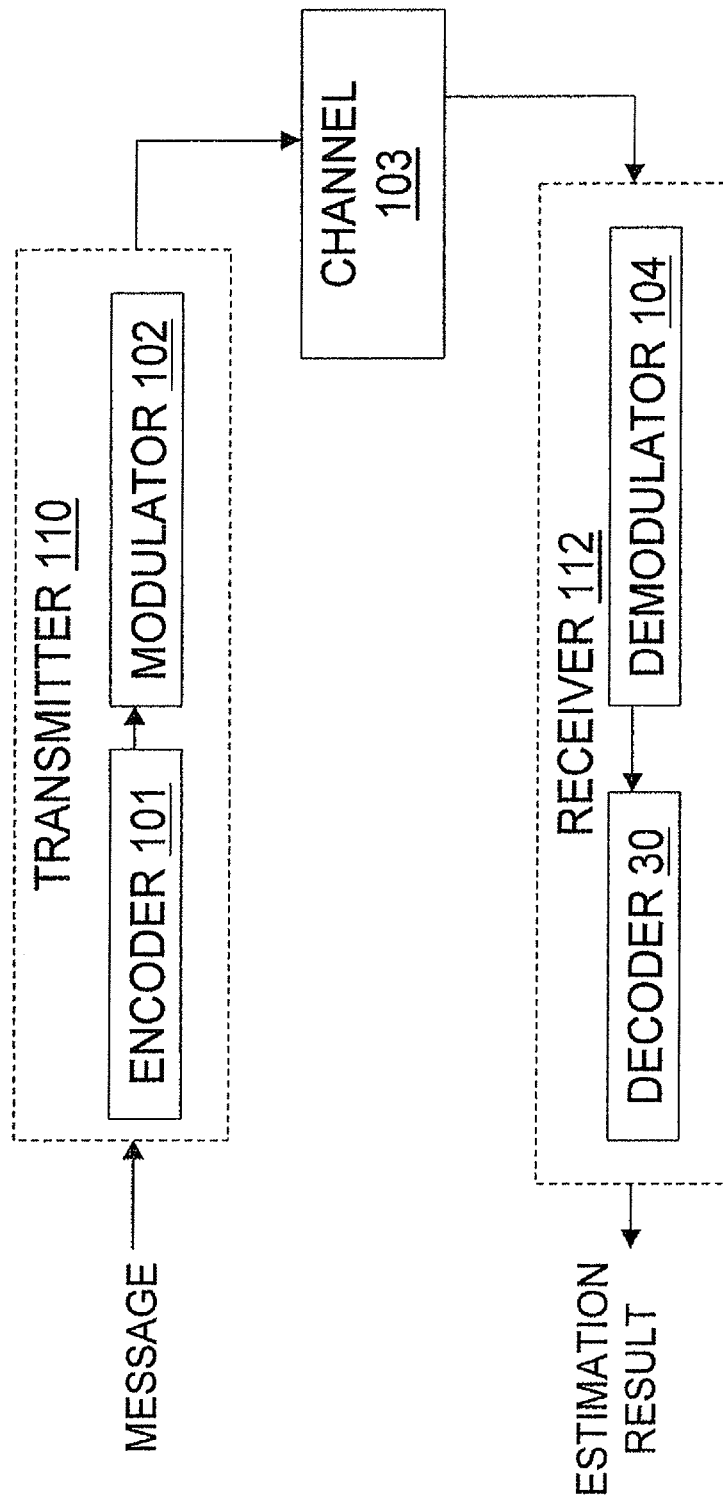
FIG. 12 is a high-level schematic block diagram of a communication system whose receiver includes the decoder of FIG. 7A.

FIG. 12 is a high-level schematic block diagram of a communication system 100 that includes a transmitter 110, a channel 103 and a receiver 112. Transmitter 110 includes an encoder 101 and a modulator 102. Receiver 112 includes a demodulator 104 and decoder 30. Encoder 101 receives a message and generates a corresponding codeword. Modulator 102 subjects the generated codeword to a digital modulation such as BPSK, QPSK or multi-valued QAM and transmits the resulting modulated signal to receiver 12 via channel 103. At receiver 112, demodulator 104 receives the modulated signal from channel 103 and subjects the received modulated signal to a digital demodulation such as BPSK, QPSK or multi-valued QAM. Decoder 30 decodes the resulting representation of the original codeword as described above. Alternatively, receiver 112 could include decoder 31 instead of decoder 30.

Returning now to the issue of slow convergence of a block decoder, for example, slow convergence of a LDPC decoder because of the presence of a trapping set, most conventional criteria for interrupting iterative block decoding (e.g., terminating the decoding, or else modifying some of the values associated with the nodes of a Tanner graph and then resuming the decoding) are what are termed herein "order-independent" interruption criteria. These criteria inspect properties, of vectors that are involved in the iterative decoding, that are independent of the order in which specific values of the vector elements appear in the vectors. For example, the most widely used criterion for testing the convergence of a block decoder is to count the number of elements of the syndrome $H \cdot \underline{v}'$, where $\underline{v}'$ is the column vector of estimated bits, that are non-zero at the end of successive iterations. A similar criterion for interrupting a slowly converging LDPC decoder and resetting the $R_{cv}$ messages to zero or truncating the soft values $Q_v$ is that a predetermined number of elements (typically one element) of the syndrome are non-zero after a pre-determined number of iterations or after a pre-determined time or after a pre-determined number of message exchanges.

One interruption criterion previously suggested by the present inventors, specifically, one of the criteria discussed above that suggest the presence of a trapping set, is an example of what are termed herein "order-dependent" interruption criteria. This criterion is that parity check equations fail only within just one sub-graph of a graph that has been partitioned into sub-graphs as described above, while all the other parity check equations succeed. Such a restricted failure suggests that the sub-graph either is a trapping set or includes a trapping set. This criterion distinguishes among syndromes in which "0" and "1" syndrome elements appear in different orders. In general, "order-dependent" criteria distinguish among vectors in which vector elements having specific values appear in different orders. For example, an order-independent criterion that counts non-zero elements of a syndrome does not distinguish between the two syndromes (000001000001)

and (000000000011)

because both syndromes have two non-zero elements. An order-dependent syndrome does distinguish between these two syndromes. The appended claims generalize such "order-dependent" criteria to order-dependent criteria generally for interrupting the iterative decoding of any representation of a block codeword. As noted above, the interruption of an iterative decoding of a representation of a block codeword can be either a termination of the decoding (giving up on a codeword representation that is too noisy to decode) or a modification of some of the vector elements involved in the decoding in preparation for continued iterative decoding.

Figure 13:
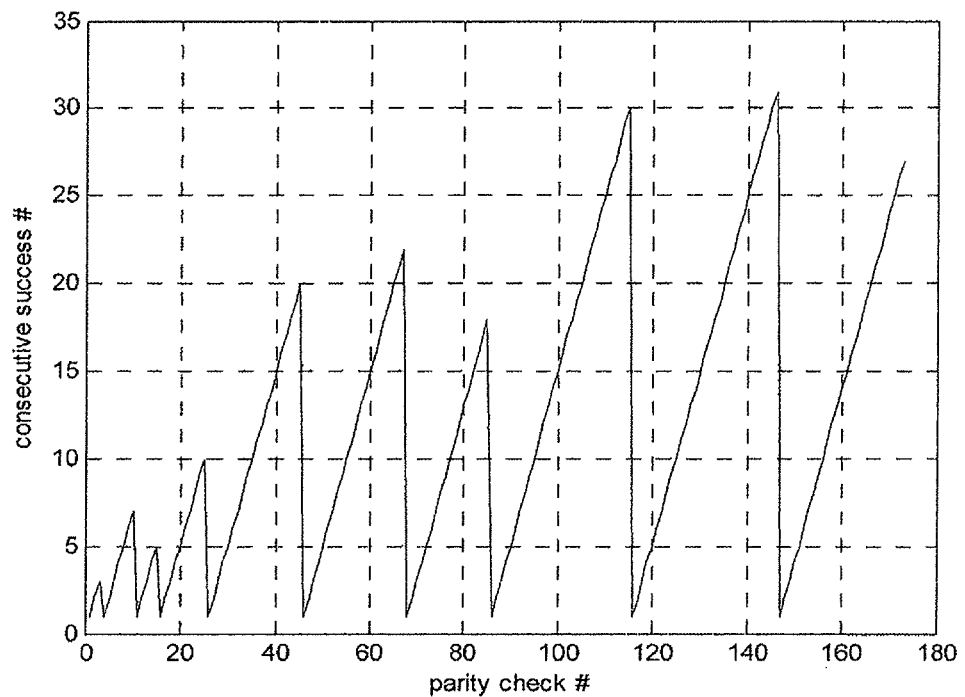
FIG. 13 is an exemplary plot of counts of successive "0"s in a syndrome in which lengths of runs of such successive "0"s tend to increase.
Figure 14:
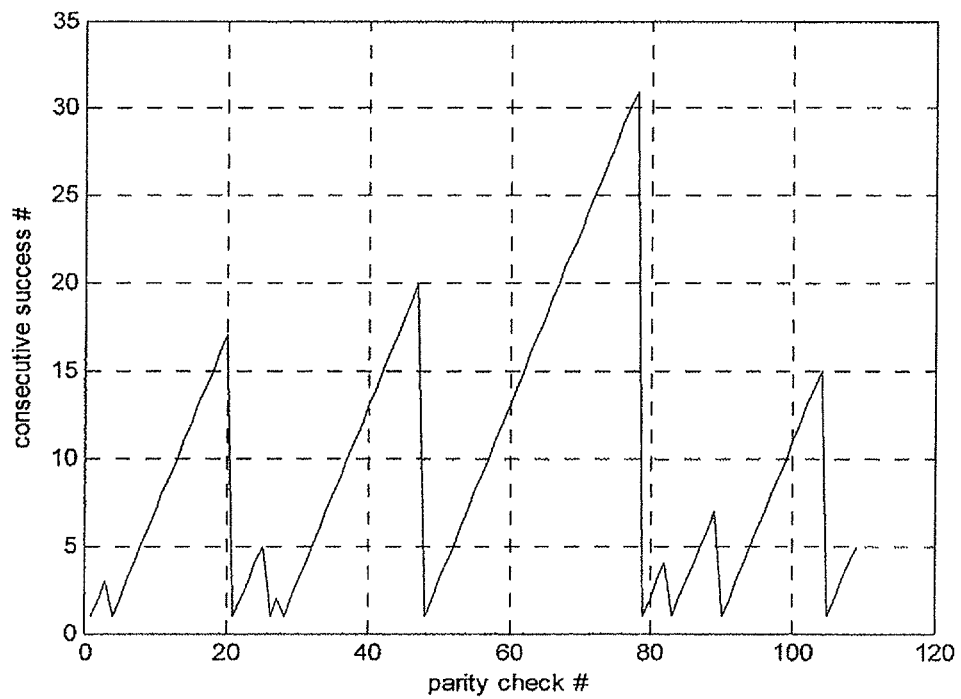
FIG. 14 is an exemplary plot of counts of successive "0"s in a syndrome in which lengths of runs of such successive "0"s do not tend to increase.

FIGS. 13 and 14 illustrate an order-dependent interruption criterion that is useful for testing the convergence of block decoders generally, not just for testing for the presence of a LDPC trapping set. This criterion inspects the lengths of runs of consecutive zeros in the syndrome. In a decoding schedule that considers the parity check equations successively, for example a serial schedule LDPC decoding that traverses the check nodes, during a decoding iteration that improves the estimate of the codeword bits, it is expected that the lengths of the runs of consecutive "0"s in the syndrome should tend to increase monotonically, as illustrated in FIG. 13. FIG. 13 is an exemplary plot of counts of successive "0"s in a syndrome in which the lengths of runs of consecutive "0"s tend to increase as the decoding iteration in question progresses. The count is initialized to zero at the start of the iteration and increased by one whenever the calculations performed in connection with a parity check equation (for example, the message exchanges at a serial schedule LDPC check node) produce a "0" syndrome element. When a "1" syndrome element is produced, the count is re-set to zero. That the lengths of runs of successive "0"s do not tend to increase monotonically, as illustrated in FIG. 14, suggests a need to interrupt the decoding. The runs of successive "0" elements inspected by this criterion may be all within one decoding iteration or may span the boundary between two decoding iterations.

That the lengths of runs of consecutive "0"s "tends" to increase includes but is not limited to monotonic increase of the lengths of consecutive runs of "0"s. For example, in FIG. 13, the seventh run of consecutive "0"s is shorter than the sixth run of consecutive "0"s. One operational definition of a tendency to increase is that a running average of the lengths of consecutive runs of consecutive "0"s, computed within a user-defined sliding window over the consecutive runs of consecutive "0"s, increases monotonically. The selection of an appropriate window length is well within the skill of those ordinarily skilled in the art.

Other useful order-dependent interruption criteria, that are evaluated at the ends of two or more successive iterations, include the largest number of consecutive "0"s in the syndrome not increasing in two successive decoding iterations and the largest number of "0"s in the syndrome not increasing monotonically in a predetermined number of decoding iterations.

Returning to the issue of trapping sets, another useful criterion for suggesting the presence of a trapping set in a LDPC graph is that a norm of the absolute values of the $Q_v$'s within one of the sub-graphs fails to increase in successive iterations. This norm could be any mathematical norm function known to those skilled in the art. Exemplary norms include a L1 norm $$\Sigma |Q_v|$$

and a L2 norm $$\sqrt{\Sigma |Q_v|^2}$$

where the sums are over the bit nodes of a sub-graph that is suspected to be or to include a trapping set.

A similar interruption criterion is based on the norm of absolute values of the $Q_v$'s whose bit nodes contribute, via the associated codeword bit estimates, to the non-zero syndrome elements. That norm fails to increase within a predetermined number of iterations, for example in successive iterations, suggests the presence of a trapping set, so that the decoding should be interrupted.

For example, a threshold value S of the number of non-zero elements of the syndrome (e.g., S=8 for a code with 900 check nodes) is predefined. An upper $Q_v$ norm threshold (e.g. 8), a lower $Q_v$ norm threshold (e.g. 5) and an iteration span t also are predefined. When the number of non-zero elements of the syndrome falls below the threshold S, the bit nodes that are directly connected, in the Tanner graph, to the check nodes with non-zero syndrome elements are inspected. The norm of the associated $Q_v$'s whose absolute values are less than the predefined lower $Q_v$ norm threshold is computed. That norm fails to increase, or fails to increase above the predefined upper $Q_v$ norm threshold, after another t iterations (t=1 is the "successive iteration" case) suggests the presence of a trapping set, so that the decoding should be interrupted.

Another useful interruption criterion is based on the mutual information between the codeword and a vector that is used in the decoding iterations. The mutual information between two random variables is a quantity that measures the dependence between the two variables. The most common unit for measurement of info cation is in bit[s], when base-2 logarithms are used. Formally, the mutual information between two discrete random variables X and Y is defined as $$I(X; Y) = \sum_{y \in Y} \sum_{x \in X} p(x, y) \log \frac{p(x, y)}{p_1(x) p_2(y)}$$

where p(x,y) is the joint probability distribution function of X and Y, $p_1(x)$ is the marginal probability distribution function of X, and $p_2(y)$ is the marginal probability distribution function of Y. It can be shown that, if the definition of codeword bit values are modified by mapping v=0 into $\hat{v}=1$ and v=1 into $\hat{v}=-1$, then in a decoding procedure that exchanges messages along the edges of a Tanner graph, the mutual information between a codeword and its LLR estimate Q is $$I = \frac{1}{E} \sum 1 - \log_2(1 + e^{-\hat{v} \cdot Q_v})$$

where E is the number of edges in the Tanner graph and the sum is over the bit nodes. I is expected to increase steadily from iteration to iteration in a successful decoding. That I fails to increase from iteration to iteration suggests that the decoding should be interrupted.

This expression for I is not useful as such for testing convergence of LDPC decoding because the codeword $\underline{v}$ is unknown and is indeed what is sought by the decoding; but if most of the $Q_v$'s are correct then this expression can be approximated as $$I \approx \frac{1}{E} \sum 1 - \log_2(1 + e^{-|Q_v|})$$

Decoders 30 and 31 of FIGS. 7A and 7B respectively are modified easily to account for non-convergence and for slow convergence as described above. Specifically, routing layer 44 is modified to detect non-convergence or slow convergence according to the criteria described above, mad/write memory 35 is modified to zero out some or all of the $R_{cv}$ values, and/or processors 42 are modified to truncate some or all of the $Q_v$ values, in response to non-convergence or slow convergence as determined by routing layer 44.

Returning to the issue of using order-independent criteria to decide whether to interrupt block decoding, the conventional order-independent criteria all evaluate the behavior of the iterative decoding across at least two iterations. We have discovered order-independent criteria that can be applied after only one decoding iteration, or even before commencing any decoding iterations, to decide whether to modify (not just interrupt) the block decoding.

One such criterion is based on an estimate of the bit error rate. For a LDPC code of check node degree $d_c$ (i.e., the number of "1"s in each row of the parity-check matrix if the LDPC code is right regular, or the average number of "1"s per row if the rows do not all have the same number of "1"s if the LDPC code isn't right regular, is $d_c$), it can be shown that a good estimate of the bit error rate of a given representation of a codeword is $$q = \frac{1}{2} - \frac{1}{2}\left(1 - \frac{2W}{M}\right)^{1/d_c}$$

where M is the number of elements in the syndrome and W is the number of non-zero elements (i.e., the number of "1"s) in the syndrome. W also is called the "syndrome weight". Solving for W/M in terms of q gives $$\frac{W}{M} = \frac{1}{2} - \frac{1}{2}(1 - 2q)^{d_c}$$

For example, if the representation of the codeword has been read from a memory with a bit error rate of q=0.5% and the error correction code is a regular LDPC code with $d_c$=30, then W/M is expected to be at most about 0.13. If, before decoding or after one decoding iteration; W/M is greater than e.g. 0.15, the decoding should at least be interrupted, if not actually modified e.g. by substituting a powerful but slow decoding algorithm for a weak but fast decoding algorithm.

Figure 15:
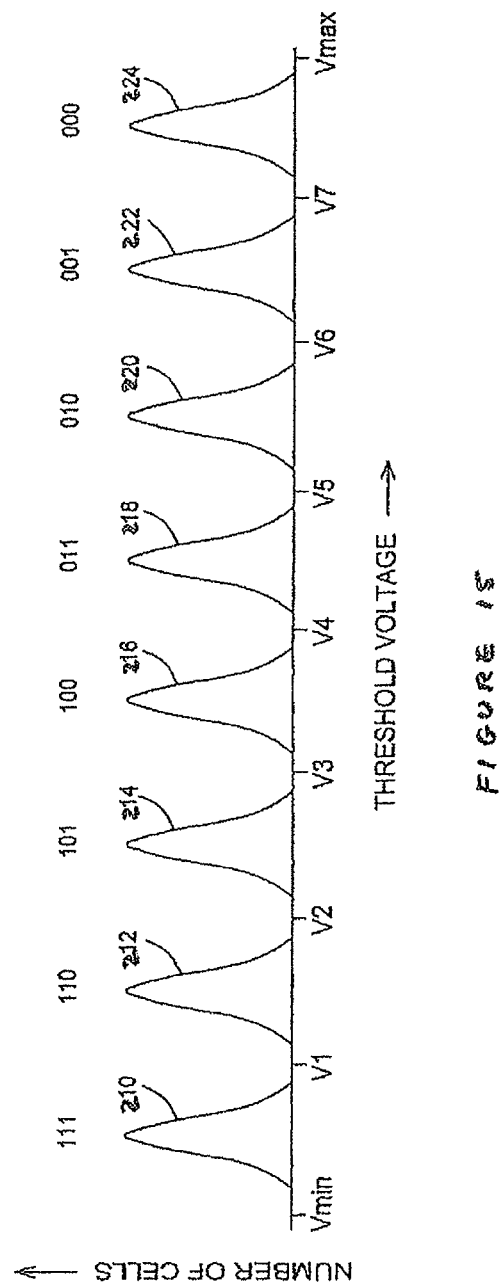
FIGS. 15 and 16 show threshold voltage distributions and reference voltages for a three-bit-per-cell flash memory.

In the case of a representation of a codeword that is obtained by reading a flash memory, if W/M is greater than expected before decoding or after a pre-determined number of decoding iterations, another option is to change how the representation of the codeword is read. Command circuits 7 and state machine 8 (FIG. 10) read a cell of memory cell array 1 by comparing the cell's threshold voltage to one or more reference voltages. FIG. 15 shows, conceptually, the nominal threshold voltage distributions of a typical flash memory that stores three bits per cell. The threshold voltages of cells that are programmed to store the bit pattern "111" are distributed statistically as shown by curve 210. The threshold voltages of cells that are programmed to store the bit pattern "110" are distributed statistically as shown by curve 212. The threshold voltages of cells that are programmed to store the bit pattern "101" are distributed statistically as shown by curve 214. The threshold voltages of cells that are programmed to store the bit pattern "100" are distributed statistically as shown by curve 216. The threshold voltages of cells that are programmed to store the bit pattern "011" are distributed statistically as shown by curve 218. The threshold voltages of cells that are programmed to store the bit pattern "010" are distributed statistically as shown by curve 220. The threshold voltages of cells that are programmed to store the bit pattern "001" are distributed statistically as shown by curve 222. The threshold voltages of cells that are programmed to store the bit pattern "000" are distributed statistically as shown by curve 224.

To read a cell that has been programmed according to the threshold voltage distributions shown in FIG. 15, command circuits 7 and state machine 8 (FIG. 10) compare the cell's threshold voltage to the reference voltages V1, V2, V3, V4, V5, V6 and V7 that appear along the horizontal axis of FIG. 15 and that demark the boundaries between the various nominal threshold voltage distributions. Although the cells of memory array 1 (in FIG. 10) are programmed according to the threshold voltage ranges shown in FIG. 15, the actual threshold voltages of the cells may drift downward or upward over time and this drift may contribute to a greater than expected value of W/M. One approach to solving this problem is to move the reference voltages downward or upward, correspondingly, to compensate for the drift. Finding the values of the reference voltages that minimize W/M is a conventional multidimensional optimization problem that typically requires re-reading the cells that store the codeword in question using different trial values of the reference voltages. Controller 20 (FIG. 10) optimizes the reference voltages accordingly and instructs command circuits 7 to use the revised reference voltages to read the relevant cells of memory array 1.

Figure 16:
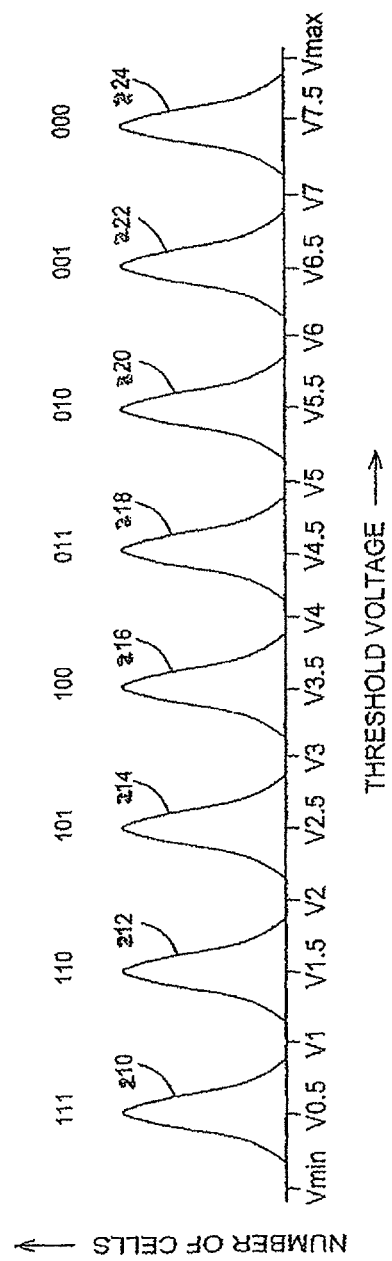

Alternatively, it may be beneficial to read the threshold voltages of the relevant cells at a finer resolution, as illustrated in FIG. 16 that shows the reference voltages of FIG. 15 supplemented by intermediate reference voltages V0.5, V1.5, V2.5, V3.5, V4.5, V5.5, V6.5 and V7.5.

The discussion above of W/M assumes that all of the stored bits are equally reliable (bit error rate q). W/M also can be estimated for the case of different stored bits having different reliabilities. For example, in the bit pattern assignments of FIG. 15, the least significant bit changes between adjacent threshold voltage distribution curves, the bit of intermediate significance changes between pairs of adjacent threshold voltage distribution curves, and the most significant bit changes only between threshold voltage distribution curves 216 and 218. A downward drift over time of the threshold voltage of any cell other than a cell that stores the bit pattern "111" may lead to the least significant bit stored in that cell being read erroneously. A downward drift over time of the threshold voltage of a cell that stores one of the bit patterns "101", "011" or "001" is more likely to lead to the bit of intermediate significance that is stored in that cell being read erroneously than is a downward drift over time of the threshold voltage of a cell that stores one of the other bit patterns. A downward drift over time of the threshold voltage of a cell that stores the bit pattern "011" is more likely to lead to the most significant bit stored in that cell being read erroneously than is a downward drift over time of the threshold voltage of a cell that stores any other bit pattern. Therefore, in a flash memory that uses the bit pattern assignment of FIG. 15, the most significant bits are more reliable than the bits of intermediate significance and the bits of intermediate significance are more reliable than the least significant bits. If the bit error rate of the most significant bits is q, the bit error rate of the bits of intermediate significance is 2q and the bit error rate of the least significant bits is 4q it can be shown that $$\frac{W}{M} = \sqrt{1 - [(1-2q)(1-4q)(1-8q)]^{d_c/3}}$$

The bit error rate q can be estimated for a specific code and flash technology via empirical measurements. For example, in each of a series of off-line simulations or measurements for a specific flash device, a codeword is stored in the flash device and is read from the flash device, the bit error rate (BER) or cell error rate (CER) is computed, and the syndrome weight W is computed. For each syndrome weight value the weighted average of the BER (or CER) is computed and tabulated. This table is then employed during the lifetime of the device by its controller in order to estimate the BER (or CER) from the syndrome weight of each codeword representation that is read from the device. Such an empirical model is preferred over the above formula because the above formula assumes, inaccurately, that the probabilities of error for each of $d_c$ bits in each check are independent. In a real life scenario this is not the case since for example two bits may arrive from the same flash cell, or one cell may induce cross coupling noise on other cells and thus even bits from different cells may have a dependency between their error probabilities if they both are affected by the same disturbing cell. Another case in which an empirical method for estimating the BER (or CER) might be preferred over the formulation presented above is when for each page of a multi-page flash memory the bit error rate is different. Furthermore, assuming that the ratio between the bit error rates of different pages is completely known (as in the above formula for 3 bits per cell) is valid only if the noise model is well defined, for example if the noise model is a Gaussian model. Unfortunately, in a real life flash device this often is not the case. Furthermore, in decoding a codeword read from a wordline of a multi-page flash memory, the number of bits from the lower page of one check can be different than the number of bits from the lower page of another check, which makes our assumption that the bits participating in each check uniformly divided between the pages of the wordline inaccurate.

The empirical simulations or measurements yield a table of W vs. q. When a codeword representation is read from the flash device, W is computed and the corresponding q is looked up in the table. If, for a specific code rate and reading resolution, q is too large, the memory controller decides whether it is worthwhile to re-read the codeword representation at a higher resolution, and if so, at what resolution, or, alternatively, whether it is necessary to change the reference voltage values that are used to read the flash memory.

The foregoing has described a limited number of embodiments of methods for decoding a representation of a codeword, of decoders that use these methods, of memories whose controllers include such decoders, and of communication systems whose receivers include such decoders. It will be appreciated that many variations, modifications and other applications of the methods, decoders, memories and systems may be made.

What is claimed is:

1. A method of decoding a representation of a codeword that encodes K information bits as N>K codeword bits, the method comprising:
   (a) importing the representation of the codeword from a channel;
   (b) in a plurality of decoding iterations, updating estimates of the codeword bits, wherein the updating includes, in a graph that includes N bit nodes and N−K check nodes, exchanging messages between the bit nodes and the check nodes; and
   (c) interrupting the decoding iterations if an interruption criterion, that includes an estimate of mutual information between the codeword and a vector that is used in the decoding iterations, is satisfied, wherein the interrupting includes modifying at least one element of at least one vector associated with the decoding and then resuming the decoding iterations, wherein the vector, the estimate of mutual information between which and the codeword is included in the interruption criterion, is a vector of N LLR estimates Q of the codeword bits and wherein the estimate of mutual information is $$\frac{1}{E}\sum 1 - \log_2(1 + e^{-|Q|}),$$

where E is a number of edges in the graph.

2. The method of claim 1, wherein the updating includes, in a parity check matrix that includes N−K rows and N columns, exchanging messages between the rows and the columns.

3. The method of claim 1, wherein the interrupting is terminating the decoding iterations.

4. A decoder for decoding a representation of a codeword that encodes K information bits as N>K codeword bits, comprising a processor for executing an algorithm for decoding the representation of the codeword by steps including:
   in a plurality of decoding iterations, updating estimates of the codeword bits, wherein the updating includes, in a graph that includes N bit nodes and N−K check nodes, exchanging messages between the bit nodes and the check nodes; and
   interrupting the decoding iterations if an interruption criterion, that includes an estimate of mutual information between the codeword and a vector that is used in the decoding iterations, is satisfied, wherein the interrupting includes modifying at least one element of at least one vector associated with the decoding and then resuming the decoding iterations, wherein the vector, the estimate of mutual information between which and the codeword is included in the interruption criterion, is a vector of N LLR estimates Q of the codeword bits and wherein the estimate of mutual information is $$\frac{1}{E}\sum 1 - \log_2(1 + e^{-|Q|}),$$

where E is a number of edges in the graph.

5. A memory controller comprising:
   an encoder for encoding K information bits as a codeword of N>K codeword bits; and
   a decoder including a processor for executing an algorithm for decoding a representation of the codeword by steps including:
   in a plurality of decoding iterations, updating estimates of the codeword bits, wherein the updating includes, in a graph that includes N bit nodes and N−K check nodes, exchanging messages between the bit nodes and the check nodes, and
   interrupting the decoding iterations if an interruption criterion, that includes an estimate of mutual information between the codeword and a vector that is used in the decoding iterations, is satisfied, wherein the interrupting includes modifying at least one element of at least one vector associated with the decoding and then resuming the decoding iterations, wherein the vector, the estimate of mutual information between which and the codeword is included in the interruption criterion, is a vector of N LLR estimates Q of the codeword bits and wherein the estimate of mutual information is $$\frac{1}{E}\sum 1 - \log_2(1 + e^{-|Q|}),$$

Where E is a number of edges in the graph.

6. The memory controller of claim 5, further comprising:
   circuitry for storing at least a portion of the codeword in a memory and for retrieving a representation of the at least portion of the codeword from the memory.

7. A memory device comprising:
   the memory controller of claim 6; and
   the memory.

8. A receiver comprising:
   a demodulator for demodulating a message received from a communication channel, thereby producing a representation of a codeword that encodes K information bits as N>K codeword bits; and
   a decoder including a processor for executing an algorithm for decoding the representation of the codeword by steps including:
   in a plurality of decoding iterations, updating estimates of the codeword bits, wherein the updating includes, in a graph that includes N bit nodes and N−K check nodes, exchanging messages between the bit nodes and the check nodes, and
   interrupting the decoding iterations if an interruption criterion, that includes an estimate of mutual information between the codeword and a vector that is used in the decoding iterations, is satisfied, wherein the interrupting includes modifying at least one element of at least one vector associated with the decoding and then resuming the decoding iterations, wherein the vector, the estimate of mutual information between which and the codeword is included in the interruption criterion, is a vector of N LLR estimates Q of the codeword bits and wherein the estimate of mutual information is $$\frac{1}{E}\sum 1-\log_2(1+e^{-|Q|}),$$

where E is a number of edges in the graph.

9. A communication system for transmitting and receiving a message, comprising:
   a transmitter including:
     an encoder for encoding K information bits of the message as a codeword of N>K codeword bits, and
     a modulator for transmitting the codeword via a communication channel as a modulated signal; and
   a receiver including:
     a demodulator for receiving the modulated signal from the communication channel and for demodulating the modulated signal, thereby producing a representation of the codeword, and
     a decoder including a processor for executing an algorithm for decoding the representation of the codeword by steps including:
       in a plurality of decoding iterations, updating estimates of the codeword bits, wherein the updating includes, in a graph that includes N bit nodes and N−K check nodes, exchanging messages between the bit nodes and the check nodes, and
       interrupting the decoding iterations if an interruption criterion, that includes an estimate of mutual information between the codeword and a vector that is used in the decoding iterations, is satisfied, wherein the interrupting includes modifying at least one element of at least one vector associated with the decoding and then resuming the decoding iterations, wherein the vector, the estimate of mutual information between which and the codeword is included in the interruption criterion, is a vector of N LLR estimates Q of the codeword bits and wherein the estimate of mutual information is $$\frac{1}{E}\sum 1-\log_2(1+e^{-|Q|}),$$

where E is a number of edges in the graph.

10. A non-transitory computer readable storage medium having computer readable code embodied on the computer readable storage medium, the computer readable code for decoding a representation of a codeword that encodes K information bits as N>K codeword bits, the computer readable code comprising:
    program code for, in a plurality of decoding iterations, updating estimates of the codeword bits, wherein the updating includes, in a graph that includes N bit nodes and N−K check nodes, exchanging messages between the bit nodes and the check nodes; and
    program code for interrupting the decoding iterations if an interruption criterion, that includes an estimate of mutual information between the codeword and a vector that is used in the decoding iterations, is satisfied, wherein the interrupting includes modifying at least one element of at least one vector associated with the decoding and then resuming the decoding iterations, wherein the vector, the estimate of mutual information between which and the codeword is included in the interruption criterion, is a vector of N LLR estimates Q of the codeword bits and wherein the estimate of mutual information is $$\frac{1}{E}\sum 1-\log_2(1+e^{-|Q|}),$$

where E is a number of edges in the graph.

* * * * *